United States Patent [19]

Shimabukuro et al.

[11] Patent Number: 5,557,774
[45] Date of Patent: Sep. 17, 1996

[54] METHOD FOR MAKING TEST ENVIRONMENTAL PROGRAMS

[75] Inventors: Jun Shimabukuro, Kawasaki; Yuji Nagamatsu, Sagamihara; Yoshimi Ikeuchi; Kazuyuki Kondo, both of Yokohama, all of Japan

[73] Assignees: Hitachi, Ltd., Tokyo; Hitachi Keiyo Engineering Co., Ltd., Chiba-ken, both of Japan

[21] Appl. No.: 214,688

[22] Filed: Mar. 17, 1994

[30] Foreign Application Priority Data

Mar. 22, 1993 [JP] Japan .................................. 5-061802
Jun. 2, 1993 [JP] Japan .................................. 5-131842

[51] Int. Cl.$^6$ ........................................................ G06F 17/60
[52] U.S. Cl. .................... 395/500; 395/183.22; 364/488; 364/578; 371/27
[58] Field of Search ............................... 395/500, 183.02, 395/183.06, 183.12, 183.22; 364/578, 488, 489, 490; 371/22.2, 22.5, 22.6, 27

[56] References Cited

U.S. PATENT DOCUMENTS

| 4,967,367 | 10/1990 | Piednoir ................................ | 364/489 |
| 5,282,146 | 1/1994 | Alhara et al. ........................ | 364/489 |
| 5,359,539 | 10/1994 | Matsumoto et al. ................. | 364/489 |
| 5,367,468 | 11/1994 | Fukasawa et al. .................. | 364/490 |
| 5,396,435 | 3/1995 | Ginetti ................................ | 364/489 |
| 5,404,319 | 4/1995 | Smith et al. ........................ | 364/578 |

FOREIGN PATENT DOCUMENTS 62-274436 11/1987 Japan .

OTHER PUBLICATIONS

Nakamura, Hidefumi, et al. "An Exchange Speech Path Subsystem Simulator as a Debugging Tool for Switching Program," The Institute of Electronics, Information and Communication Engineers of Japan, Technical Reports SSE 89–163, pp. 1–6. (English Abstract) (month is not available).

Jiemin, Gong, et al. "A Tool to Generate DEBUG Program of Arbitrary Type of Microprocessors," IEEE Computer Society Press, Proceedings of COMPAC '89, pp. 543–547. (English) Sep. 1989.

Dewey, Allen. "VHDL and Next–Generation Design Automation," IEEE Design & Test of Computers, vol. 9, No. 2, Jun. 1992, pp. 6–7. (English).

(List continued on next page.)

Primary Examiner—Kevin J. Teska
Assistant Examiner—Tan Nguyen
Attorney, Agent, or Firm—Fay, Sharpe, Beall, Fagan, Minnich & McKee

[57] ABSTRACT

Test environmental programs are prepared using the following steps: Upon application of H/W specification information containing information on the system architecture, a guidance is displayed based on the H/W specification information and the user is caused to input subsystem definition information. The H/W specification information and the subsystem definition table are related to each other to prepare the specification description of system architecture, which is used together with the simulator in a simulator library to generate test environment programs according to a testee designation. In the application-specific hardware simulator, a hardware simulation model simulating the I/O device behavior is prepared as follows: An internal connection analysis table and a definition table defining various system architectures are prepared from the hardware description information describing the I/O device hardware specification in the specification description language. An external I/O interface definition table is thus prepared from an I/O device hardware specification, an interface routine for data conversion between the I/O device and the application-specific hardware simulator and information from the user for designating the correspondence between the I/O device and the interface routine. These various tables are used to generate a source program for the hardware simulation model.

19 Claims, 34 Drawing Sheets

OTHER PUBLICATIONS

Thomas, Donald E., et al. "A Model and Methodology for Hardware–Software Codesign," IEEE Design & Test of Computers, vol. 10, No. 3, Sep. 1993, pp. 6–15. (English).

Collis, "The Requirements for a VHDL Based Custom IC, ASIC, of FPGA Design Process", IEEE Apr. 1993, pp. 7/1–7/7.

Renous et al., "WHISTLE: A Workbench for Test Development of Library–Based Designs", IEEE Apr. 1989, pp. 27–41.

FIG. 3
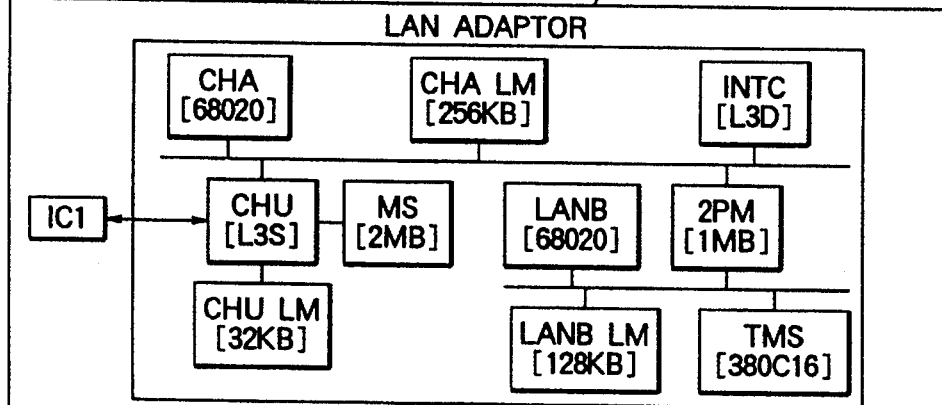
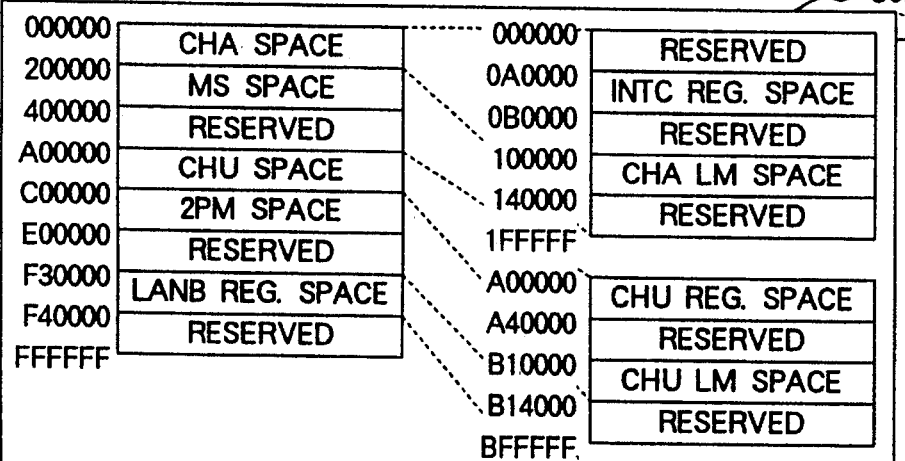
| REGISTER NAME | SET CMC FLAG REG. |  |
|---|---|---|
| ADDRESS | F3E006 | |
| BIT POSITION | BIT NAME | FACILITY/MEANING |
| 15 ⋮ 0 | - ⋮ - | ARBITRARY: INTERRUPT NOTICE TO LANB |
| 0 | ENBL | 1: PERMIT INT. |

| START ADDRESS | END ADDRESS | SIMULATOR | |
|---|---|---|---|
| 0A0000 | 0AFFFF | INTC I/O Sim. | ~709 |
| 100000 | 13FFFF | CHA MPU Sim. | |
| 200000 | 3FFFFF | CHA MPU Sim. | |
| ⋮ | ⋮ | ⋮ | |
| F30000 | F3FFFF | LANB I/O Sim. | |

| ADDRESS | BIT POSITION | VALUE | FACILITY | |
|---|---|---|---|---|
| F3E006 | - | ARBITRARY | INTERRUPT | ~717 |
| F3E008 | 0 | 1 | DEBUGGING | |
| ⋮ | ⋮ | ⋮ | ⋮ | |

FIG. 30

| MODULE NAME | EXTERNAL LINE | | INTERNAL LINE | | I/O CLASS |
|---|---|---|---|---|---|
| | LINE NAME | EFFECTIVE BIT | LINE NAME | EFFECTIVE BIT | |
| MODULE 1 | EIL1 | 7-0 | IL1 | 7-0 | INPUT |
| MODULE 1 | EIL2 | 7-0 | IL2 | 7-0 | INPUT |
| MODULE 1 | EIL3 | 7-0 | IL3 | 7-0 | INPUT |
| MODULE 1 | EOL1 | 7-0 | IL5 | 7-0 | OUTPUT |
| MODULE 1 | EOL2 | 7-0 | IL6 | 7-0 | OUTPUT |

FIG. 31

| BLOCK NAME | EXTERNAL LINE | | TERMINAL | | I/O CLASS |
|---|---|---|---|---|---|
| | LINE NAME | EFFECTIVE BIT | TERMINAL NAME | EFFECTIVE BIT | |
| BLOCK 1 | IL1 | 7-0 | IT1 | 7-0 | INPUT |
| BLOCK 1 | IL2 | 7-0 | IT2 | 7-4 | INPUT |
| BLOCK 1 | IL4 | 7-0 | OT1 | 7-0 | OUTPUT |
| BLOCK 2 | IL4 | 7-0 | IT3 | 7-0 | INPUT |
| BLOCK 2 | IL3 | 7-0 | IT4 | 7-4 | INPUT |
| BLOCK 3 | IL5 | 7-0 | OT2 | 7-0 | OUTPUT |
| BLOCK 3 | IL6 | 7-0 | OT3 | 7-0 | OUTPUT |

| MODULE NAME (10002) | REGISTER NAME (10003) | BIT WIDTH (10004) |
|---|---|---|
| MODULE 1 | REG1 | 7-0 |
| MODULE 1 | REG2 | 7-0 |

| BLOCK NAME (11002) | COMPUTATION FORMULA (11003) | TERMINAL/REGISTER | |
|---|---|---|---|
| | | TERMINAL/REGISTER NAME (11004) | EFFECTIVE TIB (11005) |
| BLOCK 1 (11006) | OT1←IT1 & IT2 | IT1 | 7-0 |
| | | IT2 | 7-0 |
| | | OT1 | 7-0 |
| BLOCK 2 | REG1←IT3\|IT4 | IT3 | 7-0 |
| | | IT4 | 7-0 |
| | | REG1 | 7-0 |
| BLOCK 2 | REG2←IT3 & IT4 | IT3 | 7-0 |
| | | IT4 | 7-0 |
| | | REG2 | 7-0 |
| BLOCK 3 | OT2←REG1 | REG1 | 7-0 |
| | | OT2 | 7-0 |
| BLOCK 3 | OT3←REG1\|RE2G | REG1 | 7-0 |
| | | REG2 | 7-0 |
| | | OT3 | 7-0 |

| OUTPUT TERMINAL/EXTERMINAL INPUT LINE | | | OUTPUT TERMINAL/EXTERMINAL OUTPUT LINE | | | COMMON NAME |
|---|---|---|---|---|---|---|
| BLOCK NAME | TERMINAL/LINE NAME | EFFECTIVE BIT | BLOCK NAME | TERMINAL/LINE NAME | EFFECTIVE BIT | |
| — | EIL1 | 7-0 | BLOCK 1 | IT1 | 7-0 | EIL1 |
| — | EIL2 | 7-0 | BLOCK 1 | IT2 | 7-4 | EIL2 |
| — | EIL3 | 7-0 | BLOCK 2 | IT4 | 7-4 | EIL3 |
| BLOCK 3 | OT1 | 7-0 | BLOCK 2 | IT3 | 7-0 | OT1 |
| BLOCK 3 | OT2 | 7-0 | — | EOL1 | 7-0 | OT2 |
| BLOCK 3 | OT3 | 7-0 | — | EOL2 | 7-0 | OT3 |

| I/O LINE | | INTERFACE ROUTINE | I/O CLASS |
|---|---|---|---|
| LINE NAME | EFFECTIVE BIT | | |
| EIL1 | 7-0 | getAbus ( ) | INPUT |
| EIL2 | 7-0 | getDbus ( ) | INPUT |
| EIL3 | 7-0 | getCbus ( ) | INPUT |
| EOL1 | 7-0 | putDbus ( ) | OUTPUT |
| EOL2 | 7-0 | putCbus ( ) | OUTPUT |

```
void module1 ( )                                  ~14001
{                                                 ~14002
    int REG1, REG2 ;                              ~14003
    int EIL1, EIL2, EIL3, OT1, OT2, OT3 ;         ~14004
                                                  ~14005
    EIL1 = getAbus ( ) ;                          ~14006
    EIL2 = getDbus ( ) ;                          ~14007
    EIL3 = getCbus ( ) ;                          ~14008
    OT1 = EIL1 & EIL2 ;                           ~14009
    REG1 = OT1 | EIL3 ;                           ~14010
    REG2 = OT1 & EIL3 ;                           ~14011
    OT2 = REG1 ;                                  ~14012
    OT3 = REG1 | REG2 ;                           ~14013
    putDbus (OT2)                                 ~14014
    putCbus (OT3)                                 ~14015
}                                                 ~14016
```

FIG. 37

```
entity Module1 is
    port(EIL1 : in BIT_VECTOR(7 downto 0) ;
         EIL2 : in BIT_VECTOR(7 downto 0) ;
         EOL1 : out BIT_VECTOR(7 downto 0) ;
         EOL2 : out BIT_VECTOR(7 downto 0)) ;
end Module1 ;

architecture STRUCTURAL of Module1 is
    signal IL4 : BIT_VECTOR(7 downto 0) ;
    compornent Block1
        port(IT1 : in BIT_VECTOR(7 downto 0) ;
             IT2 : in BIT_VECTOR(7 downto 4) ;
             OT1 : out BIT_VECTOR(7 downto 0)) ;
    end component ;
    component Block2
        port(IT3 : in BIT_VECTOR(7 downto 0) ;
             IT4 : in BIT_VECTOR(7 downto 4)) ;
    end component ;
    component Block3
        port(OT2 : out BIT_VECTOR(7 downto 0) ;
             OT3 : out BIT_VECTOR(7 downto 4)) ;
    end component ;
begin
    Blk1 : Block1 port map(IT1 => EIL1, IT2 => EIL2, OT1 => IL4) ;
    Blk2 : Block2 port map(IT3 => IL4, IT4 => EIL3) ;
    Blk3 : Block3 port map(OT2 => EOL1, OT3 => EOL2) ;
end STRUCTURAL ;
```

METHOD FOR MAKING TEST ENVIRONMENTAL PROGRAMS

BACKGROUND OF THE INVENTION

The present invention relates to a method of making environmental programs for testing the software built in a plurality of input/output devices making up a computer system, or more in particular to a method of making an application-specific hardware simulator for testing/debugging by simulation the software for embedded system with a general-purpose computer different from a target machine.

The conventional test environment programs for testing the software built in a plurality of subsystems making up a computer system are described, for example, in "An exchange speech path subsystem simulator as a debugging tool for switching program" H. Nakamura, et al., The Institute of Electronics, Information and Communication Engineers of Japan, Technical Reports SSE 89–163, pp. 1–6. More specifically, this thesis discloses environmental programs comprised of an MPU simulator operated as a subsystem for executing a testee program, an application-specific hardware simulator for simulating the behavior of other subsystems and a bus interface module engaged in the communication between them.

A conventional technique for preparing an MPU simulator according to the type of MPU is disclosed in "Gong Jiemin et al., A Tool to Generate DEBUG Program of Arbitrary Type Microprocessors, IEEE Computer Society Press, Proceedings of COMPAC '89, pp. 543–547. As described in this publication, techniques are known for generating an MPU simulator from the MPU definition information including the behavior of MPU against instruction set.

If test environmental programs described in the thesis of Nakamura are to be constructed, it is necessary for the user to collect the information required for constructing test environmental programs from the hardware specification of a system in which testee programs are embedded. For this purpose, the first problem is that the system must be fully understood by the user. The second problem is that the user is required to construct environmental programs by himself based on the information collected, and the third problem is that it is impossible to reuse the whole or part of the test environmental programs thus constructed.

A test environmental programs for simulating the behavior of an I/O device occupying an important position in a plurality of subsystems included in a computer system is disclosed by JP-A-62-274436. The simulator disclosed in this publication comprises a simulator including an application-specific hardware simulator for simulating the behavior of the I/O device and an I/O monitor which simulates the bus-line between MPU and I/O devices for controlling the execution of an application-specific hardware simulator, thus executing the software for performing the behavior logically equivalent to an actual computer system. The simulation system disclosed in the above-mentioned publication comprises a MPU simulator including a command control facility, an instruction execution facility, an interrupt accept facility, a parallel execution facility, a memory I/O facility and a memory facility, and an application-specific hardware simulator including an I/O monitor, I/O models and an I/O file. Further, the I/O monitor is comprised of a command processing facility, an I/O model execution control facility, a DMA control facility, an interrupt control facility, a real time management facility and an I/O file I/O facility. The I/O models describing the control behavior for individual I/O devices and an I/O file for collectively managing the I/O data are controlled thereby to activate the I/O models by an I/O instruction. As a result, the behavior equivalent to those of an actual computer system such as the DMA transfer between the memory facility and the I/O models, the interruption of the MPU from the I/O models and the parallel operation of the program and the I/O models are executed.

As described in IEEE Design & Test of Computers, Vol. 9, No. 2, June 1992, pp. 6–7, on the other hand, the recent trend is increasingly toward the use of the HDL (Hardware Description Language) as a language for supporting the hardware design. The hardware description language, which is widely used as a design support technique for the computer hardware, is classified into the specification description for expressing the facilities and performance conditions, the behavior description for expressing the manner in which the component elements (such as a register and an adder) are operated, and the structure description for expressing the connection between the component elements (gate level to block level).

In the conventional test environmental programs, in order to provide the general-purpose properties of the simulator, the I/O device program contained in the simulator is rewritten each time the specification of the system (I/O devices) intended for simulation is changed. If the I/O device program is to be rewritten, however, it is indispensable for the person who prepares the application-specific hardware simulator to fully understand the hardware specification of the I/O devices. This requires a great labor and poses the problem of a considerable burden imposed on the user after the specification change.

SUMMARY OF THE INVENTION

A first object of the present invention is to provide a method for preparing test environmental programs for supporting the user in the work of collecting the information required for constructing a test environmental program from the hardware specification of a system intended for test thereby to reduce the burden imposed on the user in information collection.

A second object of the invention is to provide a method for preparing test environmental programs for automatically generating test environmental programs based on the information collected for constructing the particular programs thereby to reduce the burden imposed on the user in preparing a program.

A third object of the invention is to provide a method for preparing an application-specific hardware simulator in which the whole or part of the test environmental program thus prepared is reused to reduce the burden imposed on the user in developing a new program.

A fourth object of the invention is to provide a method for facilitating the preparation of a program, called hardware simulation model, simulating the behavior of the I/O devices for the application-specific hardware simulator by utilizing the hardware specification information described by the HDL (Hardware Description Language) conventionally used for preparing the logic design or logic simulator.

In order to achieve the first and second objects described above, according to the present invention, there is provided a method comprising the following steps for preparing test environmental programs for testing the software incorporated in each of a plurality of subsystems constructing a system:

a) Step to Support the Preparation of the Specification Description of System Architecture Given hardware specification information including a hardware architecture, a memory map and a register definition, a guidance based on the particular hardware specification information is proposed to the user. Further, the specification description of system architecture including the system architecture, a memory map and subsystem facilities is prepared based on the hardware specification information and the subsystem definition information inputted by the user in conversation.

b) Step for Generating Test Environment

A guidance based on the specification description of system architecture prepared at step (a) above is proposed to the user. According to this guidance, the user designates by conversation a subsystem used by the testee software. Further, source programs for test environment including an MPU simulator for executing the testee software by simulating the behavior of the designated subsystem, application-specific hardware simulators of other subsystems and a bus interface module for controlling the communication between the MPU simulator and the application-specific hardware simulators is generated based on the designation by the user and the specification description of system architecture. The hardware simulation model, etc. required for the application-specific hardware simulator is stored in a simulator library, so that the I/O device program is prepared by the hardware simulation model processing described later.

Consequently, the system according to the present invention is inputted with the hardware specification information including the system hardware architecture, a memory map and a register definition, which can be supplied substantially directly by the hardware specification or the system specification. Thus the burden imposed on the user for collecting information on the specification is reduced. Further, the input of the subsystem definition information is guided using the previously inputted hardware specification information. Therefore, all that is required of the user is to input the necessary information by conversation in compliance with the guidance, thereby reducing the burden on the user. More specifically, according to the present invention, the information required for constructing a test environment is easily inputted thereby to achieve the first object.

Also, the specification description of system architecture is prepared from the information inputted as above, and therefore the source program for the test environment can be automatically generated simply by the user designating the testee section in accordance with the guidance involved thereby to achieve the second object.

In order to the achieve the third object described above, the test environment generation step according to the present invention retrieves and utilizes a hardware simulation model, an application-specific hardware simulator and a bus interface module as a part of the test environment programs from a simulator library. Further, the test environment programs prepared by the test environment preparation step are stored in the simulator library. In the process, system names corresponding to all the programs constituting the application-specific hardware simulator, monitor names corresponding to the bus interface modules included in the application-specific hardware simulator and subsystem names corresponding to the I/O device program included in the subsystems and designated by the user are respectively stored as parts in the simulator library.

As a result, according to the present invention, the hardware simulation models of the subsystems other than the testee subsystem and the test environment programs prepared are wholly or partly stored in the simulator library, and the parts thus stored in the library are used at the time of generation of another test environment, thereby achieving the third object.

In order to achieve the fourth object described above, according to the present invention, an hardware simulation model is prepared from hardware specification for the I/O devices described in the specification description language and the correspondence description of signal and interface routine specifying the interface between the I/O devices and the application-specific hardware simulator as described below.

c) Step for Preparation of Hardware Simulation Model

The hardware specification information describing the hardware specification of the I/O devices in the specification description language such as HDL, the interface routine for data conversion between the hardware specification of each I/O device and the application-specific hardware simulator and the correspondence description of signal and interface routine for designating the correspondence between the I/O devices and the interface routine are used to prepare the source program for the hardware simulation model, which is stored in the simulator library.

As a consequence, according to the present invention, the source program for the hardware simulation model of the application-specific hardware simulator can be prepared simply by describing the hardware specification by the HDL used for hardware design, etc. In developing test environmental programs for a system with an I/O device newly added thereto, therefore, the person preparing the test environmental programs is not required to fully understand the hardware specification of the I/O devices, thereby facilitating the development of test environmental programs.

BRIEF DESCRIPTION OF THE DRAWINGS

FIG. 3 shows an example of the hardware specification information.

FIG. 30 shows an example of the module connection definition table.

FIG. 31 shows an example of the block connection definition table.

FIG. 32 shows an example of the register definition table.

FIG. 33 shows an example of the block computation table.

FIG. 34 shows an example of the internal connection analysis table.

FIG. 35 shows an example of the external I/O interface definition table.

FIG. 36 shows an example of the source program for the I/O device program generated according to the invention.

FIG. 37 shows an example of the hardware specification corresponding to the hardware configuration shown in FIG. 29, as expressed in the hardware description language (HDL).

DESCRIPTION OF THE PREFERRED EMBODIMENTS

Embodiments of the invention will be explained below with reference to the accompanying drawings. The invention, however, is not limited to these embodiments.

First Embodiment

Figure 1:
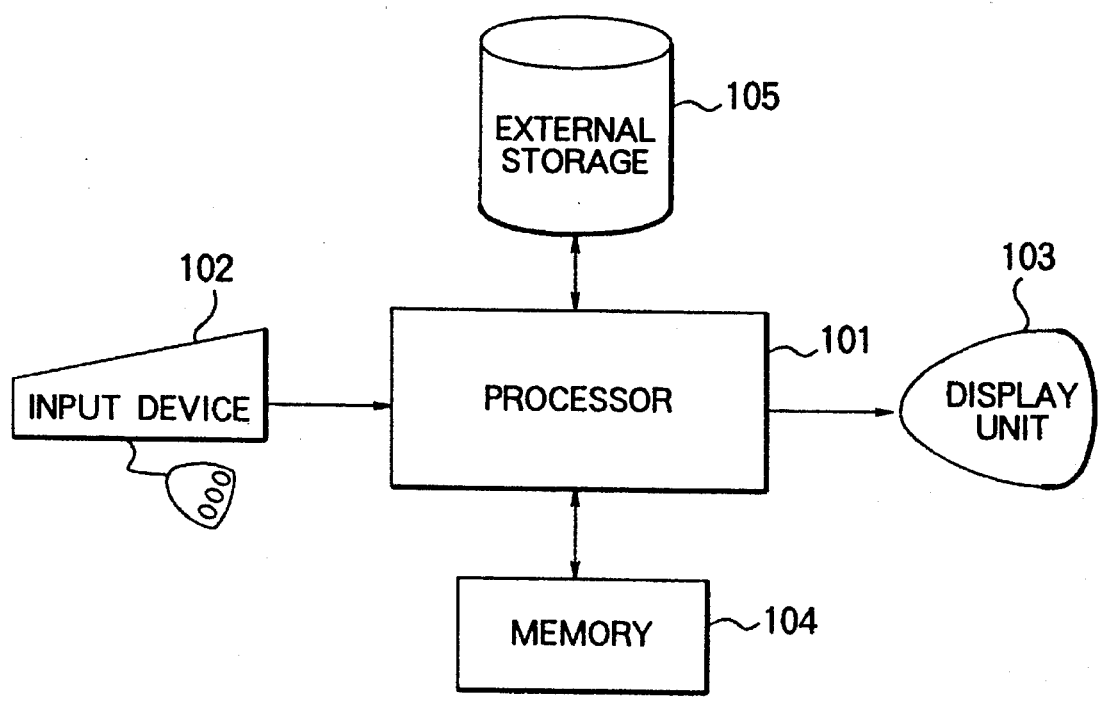
FIG. 1 shows the configuration of a computer system embodying the present invention.

The system architecture of a computer system for preparing an application-specific hardware simulator by the method according to the invention is shown in FIG. 1. The computer system 100 comprises a processing unit 101 for executing the processing program according to the invention, an input device 102 for receiving an input or an instruction from the user, a display unit 103 for proposing a guidance to the user, a memory 104 for storing the processing program according to the invention, and an external memory for storing hardware specification information and a simulator library. Each of these units is connected to the processing unit 101.

Figure 2:
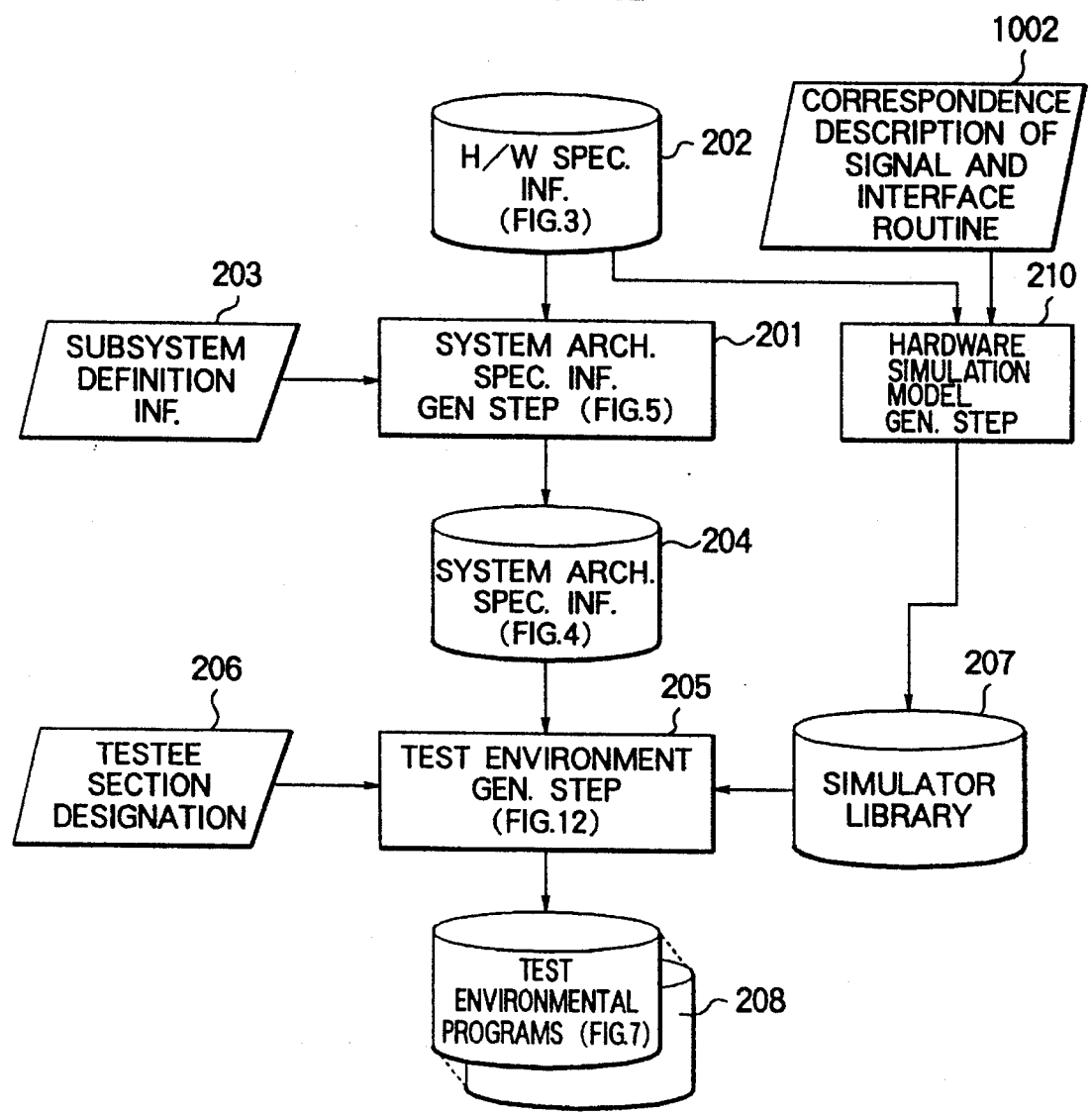
FIG. 2 shows the procedure for preparing test environmental programs according to a first embodiment.

A flowchart for executing the program according to the invention is shown in FIG. 2. The processing program shown in FIG. 2 includes (a) the step 201 supporting the preparation of the specification description of system architecture, (b) the step 205 for generating a test environment, and (c) the step 210 for generating hardware simulation model.

a) Step 201 Supporting the Preparation of Specification Description of System Architecture In the step 201 for supporting the preparation of the specification description of system architecture, upon application thereto of the hardware specification information 202 relating to the system intended for simulation, a corresponding guidance is displayed, and the conversation with the user causes the user to input the subsystem definition information 203 thereby to prepare the specification description of system architecture 204 providing detailed information required for generating a source program such as the memory map and the register definition. More specifically, the specification description of system architecture specifying the correspondence between the data contained in the hardware specification information is generated in accordance with the subsystem definition information designating the subsystem required for simulation. The design information for the system intended for simulation is directly used as the hardware specification information 202.

b) Step 205 for Generating Test Environment

The test environment preparation step 205 is such that upon application of the specification description of system architecture 204 thereto, a corresponding guidance is displayed, and by the conversation with the user, the user is caused to input the testee section designation 206 for designating the testee software, and the test environmental programs 208 are prepared by using the MPU simulator prepared for the simulator library 207.

c) Step 210 for Generating Hardware Simulation Model

In the hardware simulation model preparation step 210, a source program for the hardware simulation model is prepared by the hardware specification information with the hardware specification described in the specification description such as HDL for the I/O devices, an interface routine for data conversion between the hardware specification and the application-specific hardware simulator of each I/O device, and the correspondence description of signal and interface routine for designating the correspondence with the signal line, with the source program stored in a simulator library.

In the description and drawings below, the hardware is referred to as "H/W".

As shown in FIG. 3, the H/W specification information 202 includes a system architecture diagram 301 illustrating the H/W elements making up the whole system and the connection therebetween, a memory map 302 specifying the application of the address space for each MPU among the H/W elements, and a register definition 303 specifying the meaning of the bit and address of the register included in the system. The H/W specification information 202 is an information specifying the system architecture of a system configured of a plurality of subsystems including the one for executing the testee software, which is, for example, an exchange system or a embedded microcomputer system applied externally or described in the hardware description language (HDL). The contents shown in FIG. 3 are the H/W specification as expressed in table form or a block diagram. Also, the hardware specification information shown in FIG. 3 is the one prepared at the time of hardware design and used again as input data for the method for making test environmental program provided by the present invention.

Figure 4:
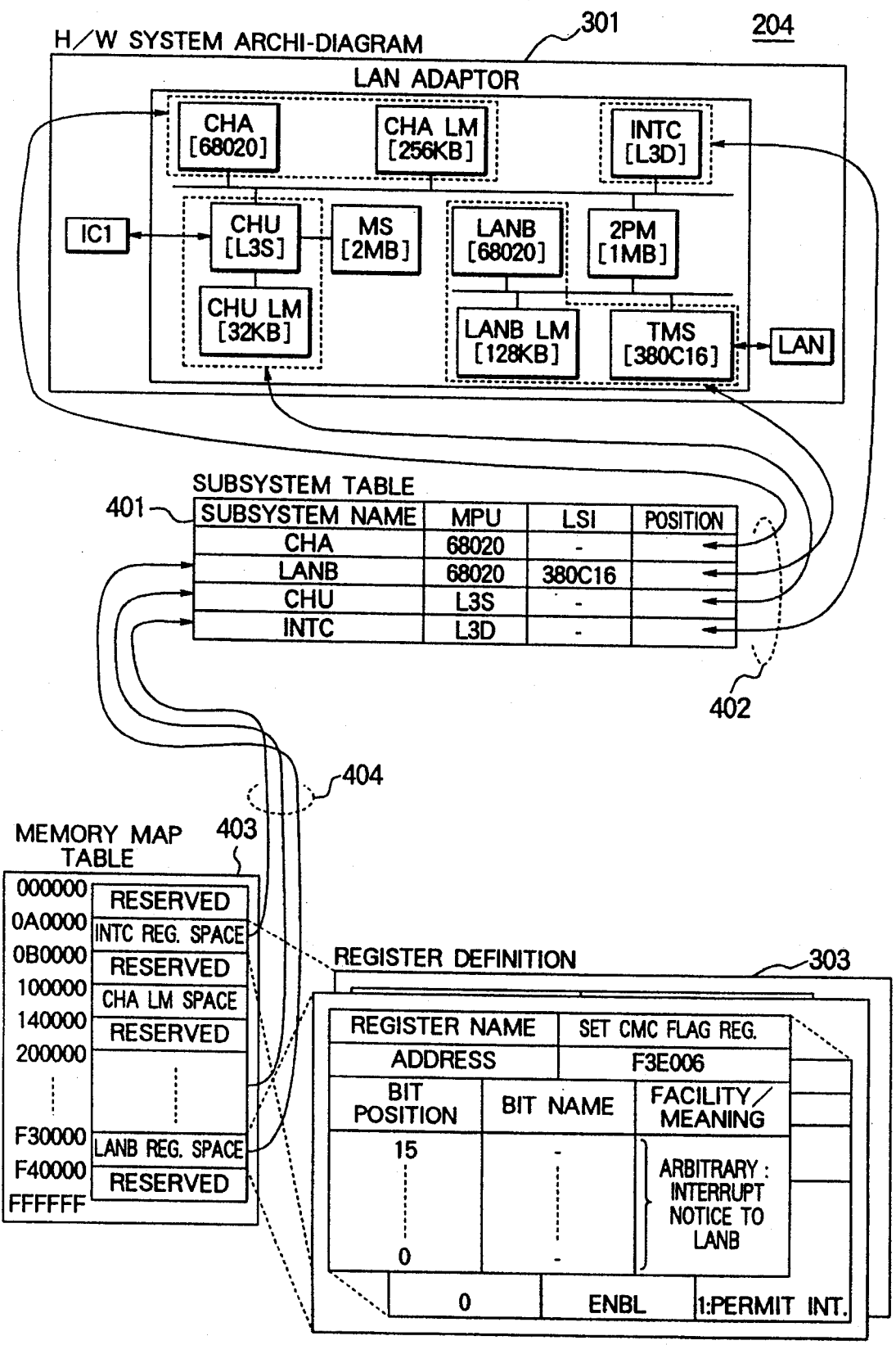
FIG. 4 shows an example of the specification description of system architecture.

As shown in FIG. 4, the specification description of system architecture 204 includes a system architecture diagram 301, a subsystem table 401 providing a list of subsystems making up the system, a memory map table 403 for developing the address space for each MPU, and a register definition 303. The system architecture diagram 301 and the register definition 303 are a transcription from the hardware specification information 202. The subsystem table 401 is prepared by the conversation with the user as described later. The memory map table 403, on the other hand, is prepared from the memory map 302 included in the hardware specification information 202.

Each element of the subsystem table 401 has the name of the particular subsystem, the information representing the type of the MPU (when the particular subsystem includes an MPU), the information representing the LSI type (when the particular subsystem includes the hardware in the form of LSI), a position pointer 402 for indicating the component element making up the subsystem on the system architecture diagram 301, and a subsystem pointer 404 designating another subsystem having the address space assigned with the particular subsystem (when the particular subsystem is assigned to the address space of the MPU of another subsystem).

Also, the pointer to each register definition 303 is developed on the memory map table 403 to permit reference to each register from the assigned address.

Figure 5:
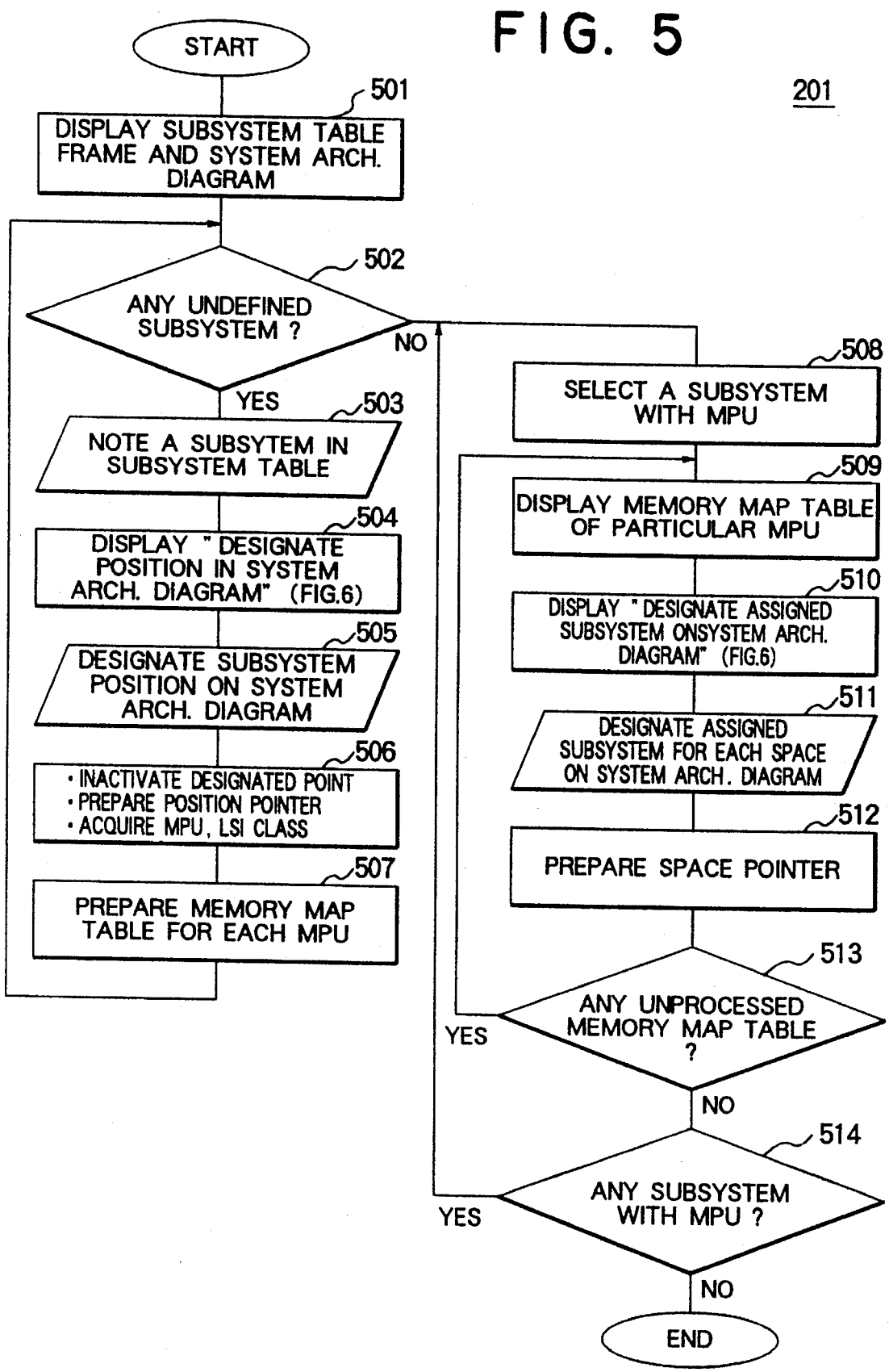
FIG. 5 is a flowchart showing the processing for supporting the preparation of the specification description of system architecture.

A flowchart for the step 201 for supporting the preparation of the specification description of system architecture is shown in FIG. 5.

Step 501 displays the frame of the subsystem table 401 and the system architecture diagram 301 on the display unit 103 for conversation with the user.

Step 502 makes enquiry of the user as to whether there is any undefined subsystem and if there is any undefined subsystem, the process is returned to step 502 after executing the steps 503 to 507, while if there is no undefined subsystem, the process proceeds to step 508.

Step 503 causes the user to input a new subsystem name in the frame of the subsystem table 401 on display.

Figure 6A:
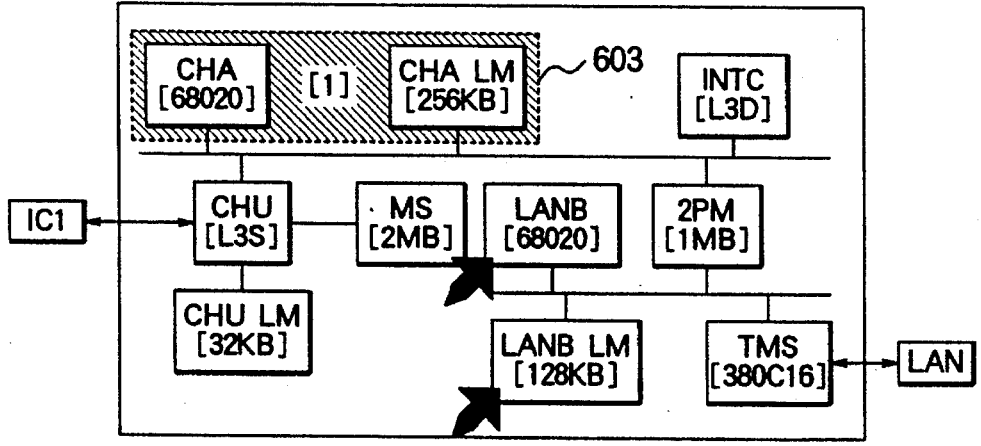
FIGS. 6A and 6B show examples of the input by conversation of the subsystem definition information.

Step 504 guides the user to designate the hardware element constituting the subsystem input with the name on the system architecture diagram 301, and step 505 causes the user to designate the desired hardware element. A screen example involved is shown as a screen 601 of FIG. 6A.

Step 506 deactivates a designated system architecture by a display indicating that the particular system architecture has already been designated in such a manner that the same system architecture element is not designated for the second time. Also, the position pointer 402 corresponding to the designated element is prepared. Further, the MPU class and the LSI class noted in the system architecture 301 are retrieved and registered with the subsystem table 401.

Step 507 prepares the memory map table 403 as the memory map 302 is developed in the memory space for each MPU in correspondence with each part in the memory map 302 for each MPU included in the subsystem. After that, the process returns to step 502 thereby to repeat the process until there is no undefined system.

Step 508, on the other hand, selects a subsystem including an MPU, and step 509 displays the memory map table 403 of the MPU of the subsystem thus selected.

Figure 6B:
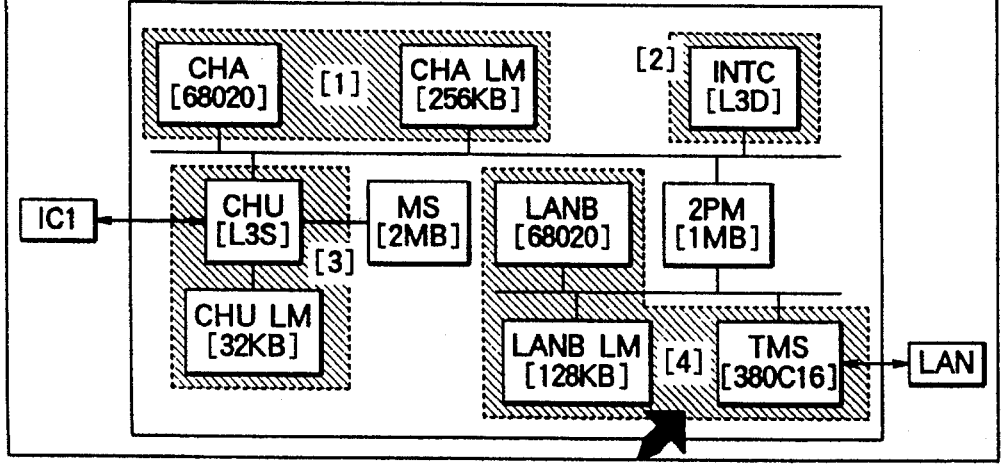

Step 510 displays a message guiding the user to designate the subsystem assigned to each space of the display memory map table 403 on the system architecture diagram 301, followed by step 511 for causing the user to designate a subsystem. A screen example involved is shown in the screen 602 of FIG. 6B.

Step 512 prepares a space pointer 404 based on the above designation.

Step 513 decides whether there is any memory map table 403 still to be processed for the MPU included in the designated subsystem (considering an I/O mapped I/O system for which a single MPU is capable of having a plurality of memory maps), and if there is any other memory map table, steps 509 to 512 are repeated, while the process proceeds to step 514 otherwise.

Step 514 decides whether there is any unprocessed subsystem including the MPU, and if there is any, steps 508 to 513 are repeated. Otherwise, the process is terminated.

Figure 7:
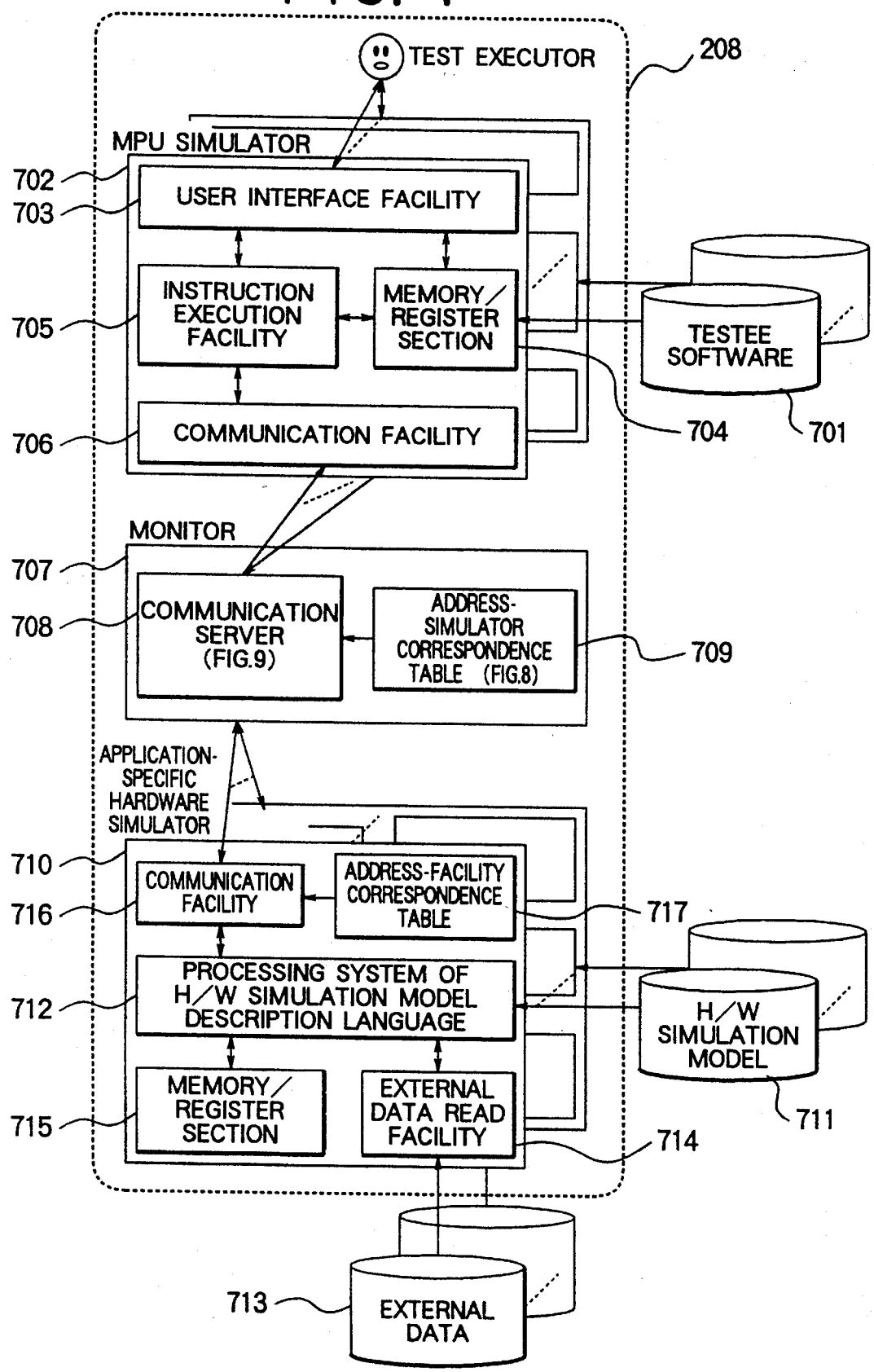
FIG. 7 is a diagram showing a configuration of the programs making up the test environment generated according to the invention.

FIG. 7 is a diagram showing a configuration of the test environment programs 208 generated by the test environment generation step 205. The test environment programs 208 include at least one MPU simulator for executing the testee software 701 on the test execution machine, at least one application-specific hardware simulator for executing the hardware simulation model 711 defining the behavior for each facility of the subsystem not including the testee software 701, and a bus interface module 707 engaged in the communication corresponding to the I/O instructions generated between these elements.

The MPU simulator 702 includes a user interface facility 703, a memory/register section 704, an instruction execution facility 705 and a communication facility 706. The user interface facility 703 processes the operation command inputted by the user and displays the value of the memory and the register. The memory/register section 704 manages the contents of a shared memory used for exchange of data between the memory and register assigned to the subsystem including the MPU and other subsystems. The instruction execution facility 705 executes the instructions of the testee software 701 read into the memory/register section 704. The communication facility 706 effects the transmission and receipt of data between the MPU simulator and the bus interface module 706.

The user interface facility 703 and the instruction execution facility 705 use the MPU simulator for various MPUs prepared in the simulator library 207. The memory/register section 704 and the communication facility 706, however, which depend on the configuration of the testee system, are prepared at the test environment generation step 205.

Figures 8, 9, 10:
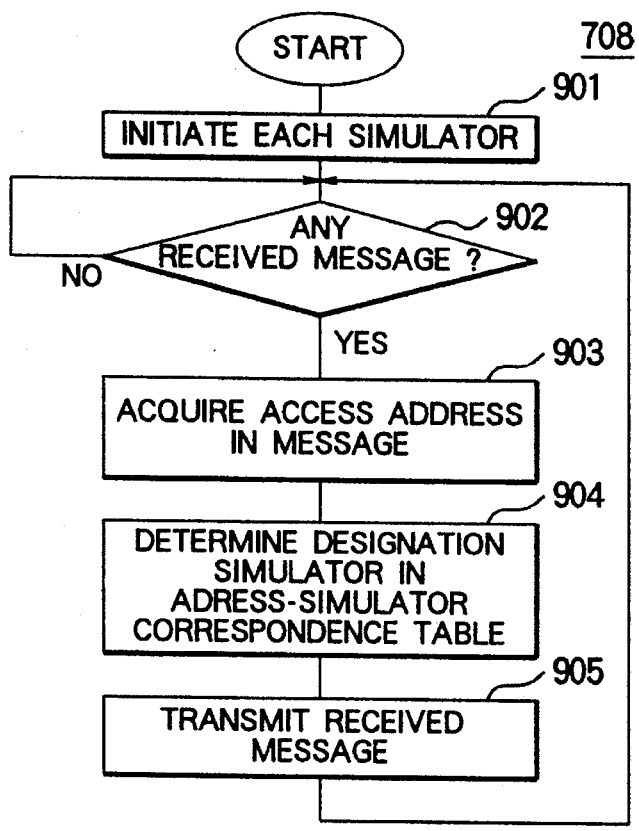
FIG. 8 shows an example of the table indicating the correspondence between addresses and simulators.
FIG. 9 is a flowchart showing the operation of the communication server included in the test environment generated according to the invention.
FIG. 10 shows an example of the table indicating the correspondence between addresses and facilities.

The bus interface module 707 includes an address-simulator correspondence table 709 and a communication server 708. The address-simulator correspondence table 709, as shown in FIG. 8, is a table showing the correspondence between the address (start address to end address) included in the communication message and the simulator for the destination of transfer, and corresponds to the memory map table 403 and the subsystem pointer 404 in FIG. 4. The communication server 708 is an infinite process for executing the flowchart shown in FIG. 9, the process of which is terminated by the test end command from the user.

In FIG. 9, the communication server 708 initiated at the time of test start activates the MPU simulator 702 and each application-specific hardware simulator 710 at step 901. Step 902 causes the communication server 708 to wait for the communication message from the simulators 702, 710. Upon receipt of the communication message, step 903 retrieves an address from the communication message, followed by step 904 for determining the destination simulator based on the previously-retrieved address with reference to the address-simulator correspondence table 709. Step 905 transfers the previously-received communication message to the destination simulator and returns the process to step 902.

The application-specific hardware simulator 710 shown in FIG. 7 includes a processing system of hardware simulation model description language 712 for executing the instructions of the hardware simulation model 711, an external data read facility 714 for reading a prepared value of the external data 713 in accordance with the instruction of the hardware simulation model 711, a memory/register section 715 for managing the value of the memory and the register assigned to the corresponding subsystem, an address-facility correspondence table 717 and a communication facility 716.

The address-facility correspondence table 717, as shown in FIG. 10, is a table showing the correspondence between the address, bit position and the set value contained in the communication message and the facility of the subsystem initiated thereby, and corresponds to the memory map table 403 and the register definition 303 shown in FIG. 4. The communication facility 716 is an infinite process for executing the process shown in FIG. 11, which is terminated by a test end command from the user.

Figure 11:
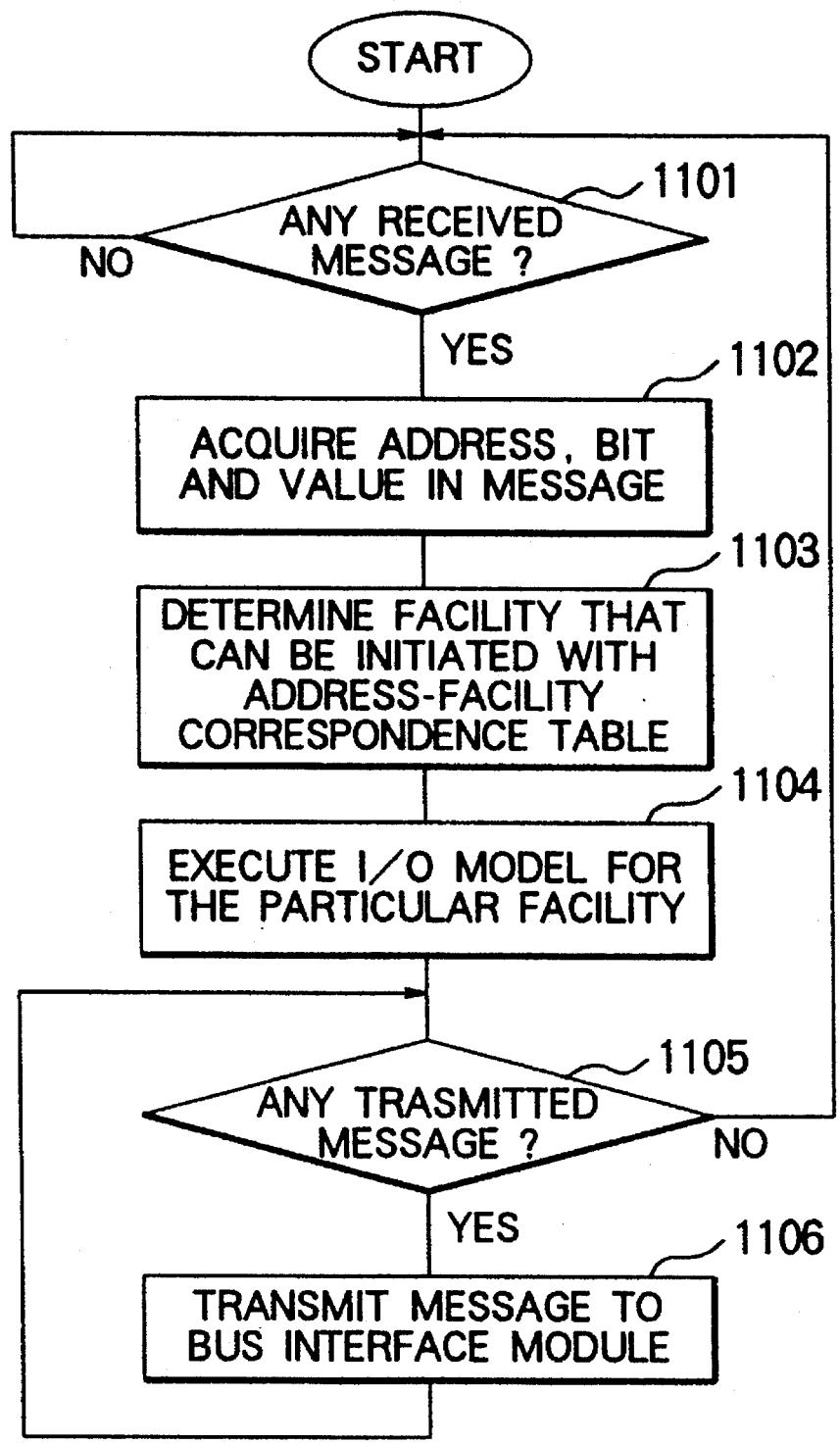
FIG. 11 is a flowchart showing the operation of the communication facility included in the test environment generated according to the invention.

In FIG. 11, the communication facility 716 initiated by the bus interface module 707 waits for the communication message from the bus interface module 707 at step 1101. Upon receipt of the communication message, step 1102 fetches the address, bit position and, the value in the message. Step 1103 determines the facility to be initiated based on the previously-acquired address, bit position and value with reference to the address-facility correspondence table 717. Step 1104 executes the hardware simulation model 711 corresponding to the determined facility at the processing system of hardware simulation model description language 712. Step 1105 returns the process to step 1101 if there is no instruction for transmitting the communication message, while if there is any instruction for transmitting the communication message, step 1106 transmits the communication message to the bus interface module 707. The communication server 708 of the bus interface module 707, by the process shown in FIG. 9, transfers the communication message to the simulator designated by the address contained in the communication message.

Figure 12:
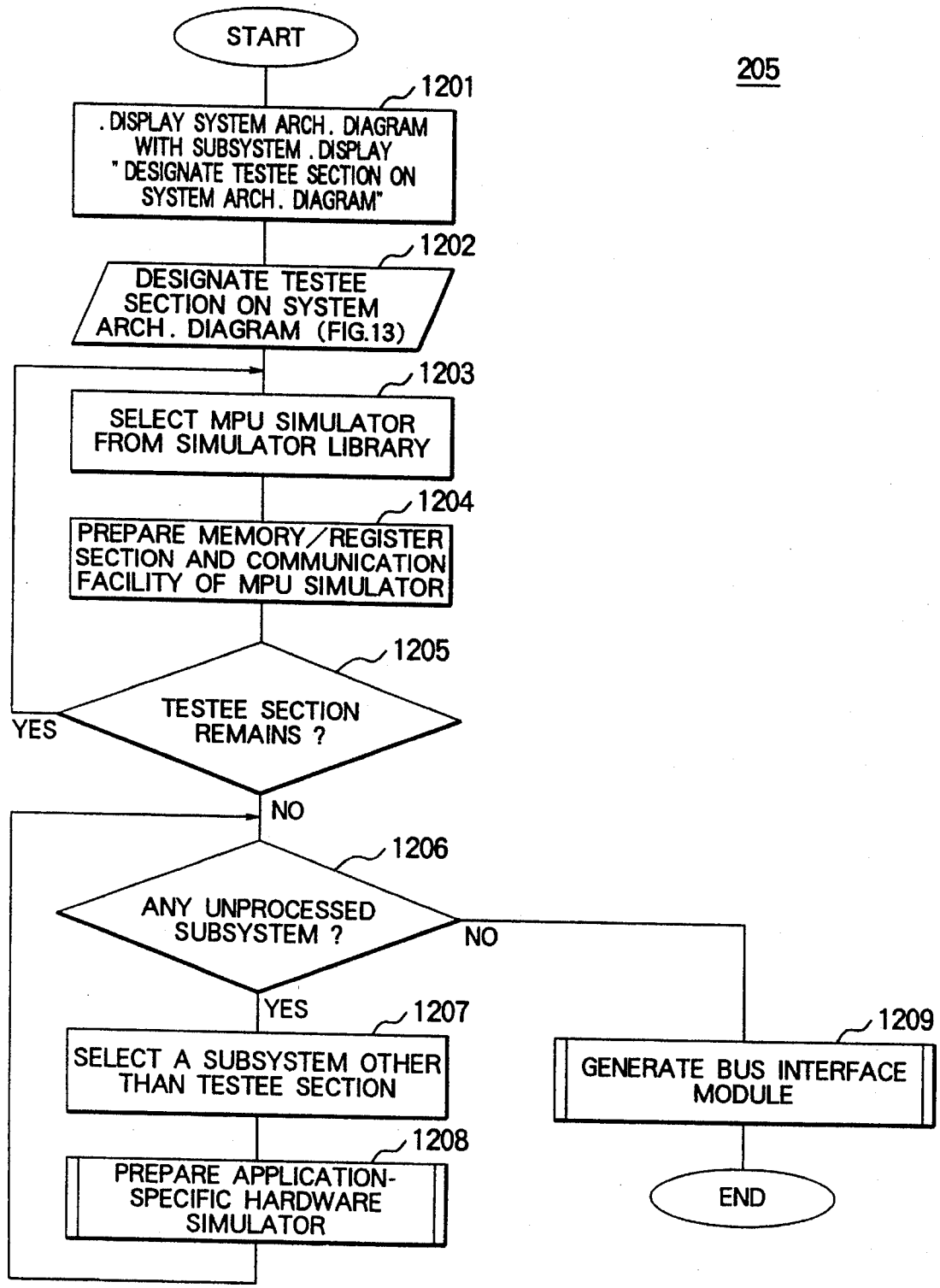
FIG. 12 is a flowchart for processing the generation of a test environment.

A flowchart for performing the test environment generation process 205 is shown in FIG. 12.

Step 1201 displays the system architecture diagram 301 for causing the user to input the testee designation 206 (FIG. 2), and displays the message prompting the user to designate a subsystem including the testee software.

Step 1202 causes the user to designate the subsystem including the testee software on the system architecture diagram 301 in accordance with the same message.

Figure 13:
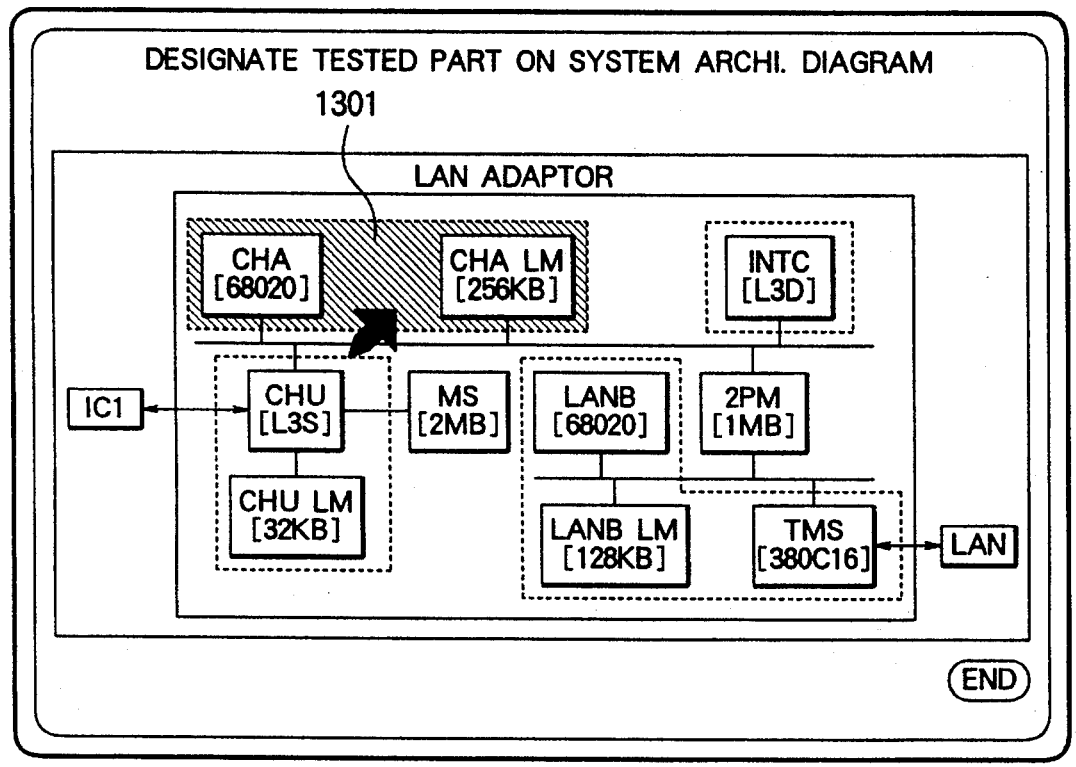
FIG. 13 shows an example of the input by conversation for designation of a testee section.

An example of the screen for conversational input of the testee section designation 206 is shown in FIG. 13. This is a screen on which the user designates one of the subsystems (1301) by mouse against the system architecture diagram 301 on display.

Step 1203 in FIG. 12 determines the MPU class with reference to the subsystem table 401 for one of several subsystems designated and selects a corresponding MPU simulator from the simulator library 207.

Step 1204 prepares the memory/register section 704 and the communication facility 706 not held in the MPU simulator as prepared in the simulator library 207. The memory/register section 704 can be prepared from the register definition 303 and the memory map table 403 shown in FIG. 4. Also, the communication facility 706 can be prepared based on the memory map table 403, the subsystem table 401 and the subsystem pointer 404.

Step 1205 decides whether there is any designated part not yet processed in the subsystem designated at step 1202, and if there is any undesignated part not processed, the process returns to step 1203. Otherwise, the process proceeds to step 1206.

Step 1206 decides whether there is any simulator not prepared among all the subsystems, and if there is any simulator not prepared, the process proceeds to step 1207. Otherwise, the process is passed to step 1209. Step 1207 selects one of the subsystems lacking the simulator.

Step 1208 generates the application-specific hardware simulator corresponding to the selected subsystem by the application-specific hardware simulator generation process, with the process returned to step 1206. The flowchart for the step 1208 of generation of the application-specific hardware simulator is shown in FIG. 14.

Figure 14:
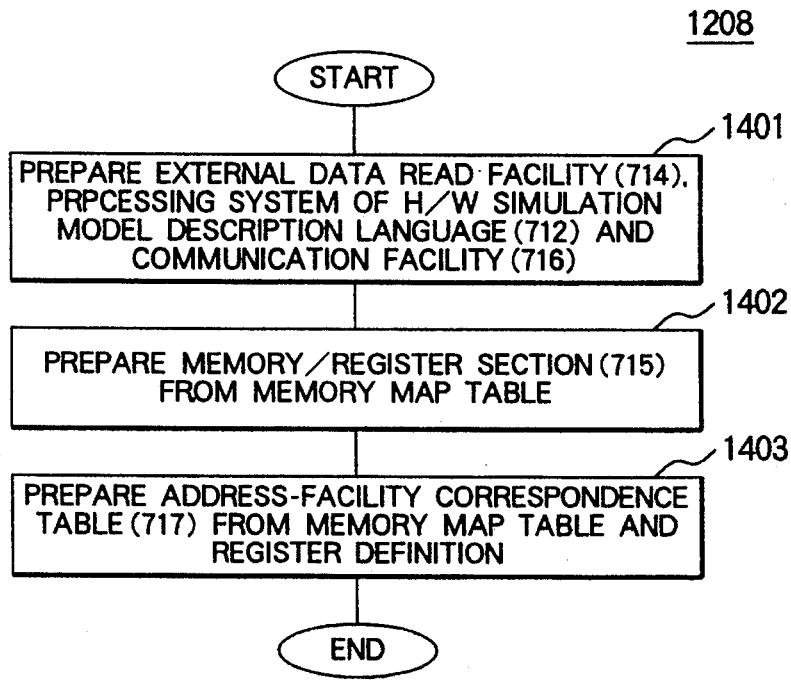
FIG. 14 is a flowchart showing the processing for generation of an application-specific hardware simulator.

Step 1401 in FIG. 14 generates the component elements of the application-specific hardware simulator independent of the system, i.e., the processing system of hardware simulation model description language 712, the external data read facility 714 and the communication facility 716.

Step 1402 generates the memory/register section 715 by obtaining from the memory map table 403 the register and the address assigned to the selected subsystem. Step 1403 generates an address-facility correspondence table 717 with reference to the register definition 303 for the assigned register.

Step 1209 in FIG. 12 generates the bus interface module by the monitor generation step. Upon generation of the bus interface module 707, the test environment programs 208 are completely generated. The flowchart for the monitor generation step 1209 is shown in FIG. 15.

Figure 15:
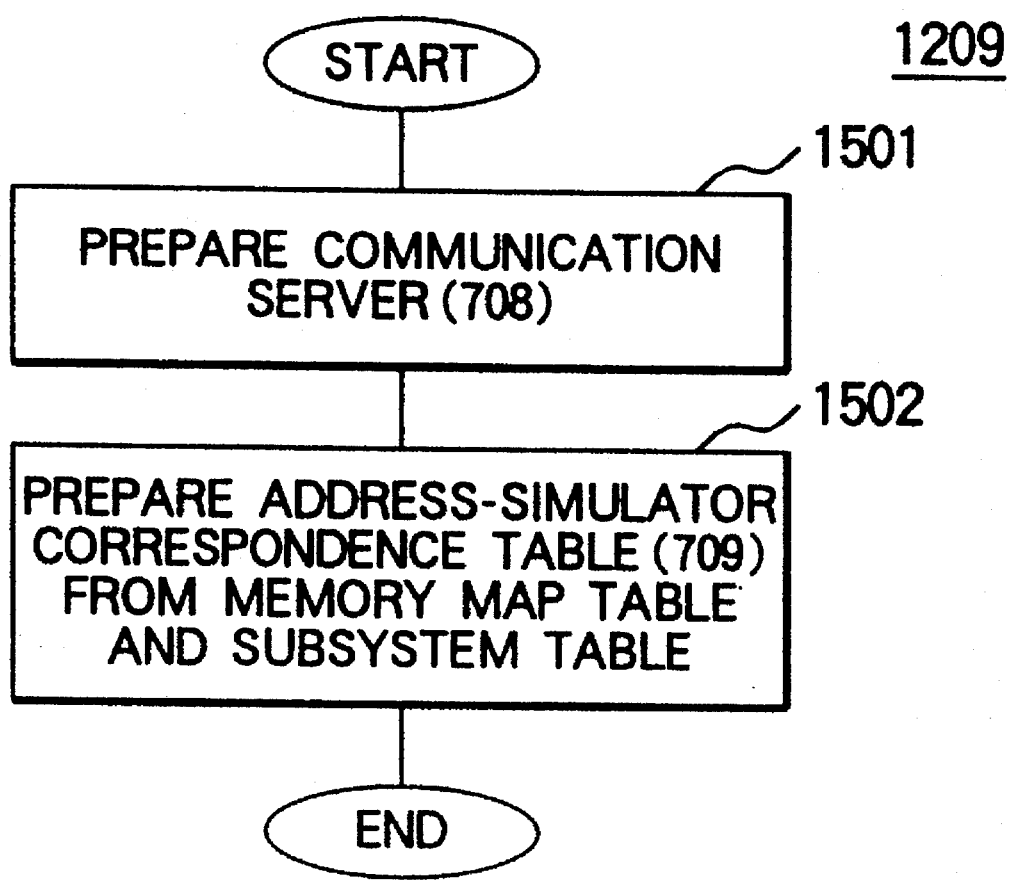
FIG. 15 is a flowchart showing the processing for preparation of the bus interface module.

Step 1501 in FIG. 15 generates the communication server 708 based on the information of the simulators thus far generated. Step 1502 generates the address-simulator correspondence table 709 based on the memory map table 403, the subsystem 401 and the subsystem pointer 404.

According to the aforementioned method for making test envronmental program, all that is required of the user is to check the specification as to the facility that the subsystem has for producing the test environment programs 208 of the system including the I/O devices.

The I/O program generation process 210 shown in FIG. 2 will be described in detail with reference to FIGS. 26 to 28.

Figure 26:
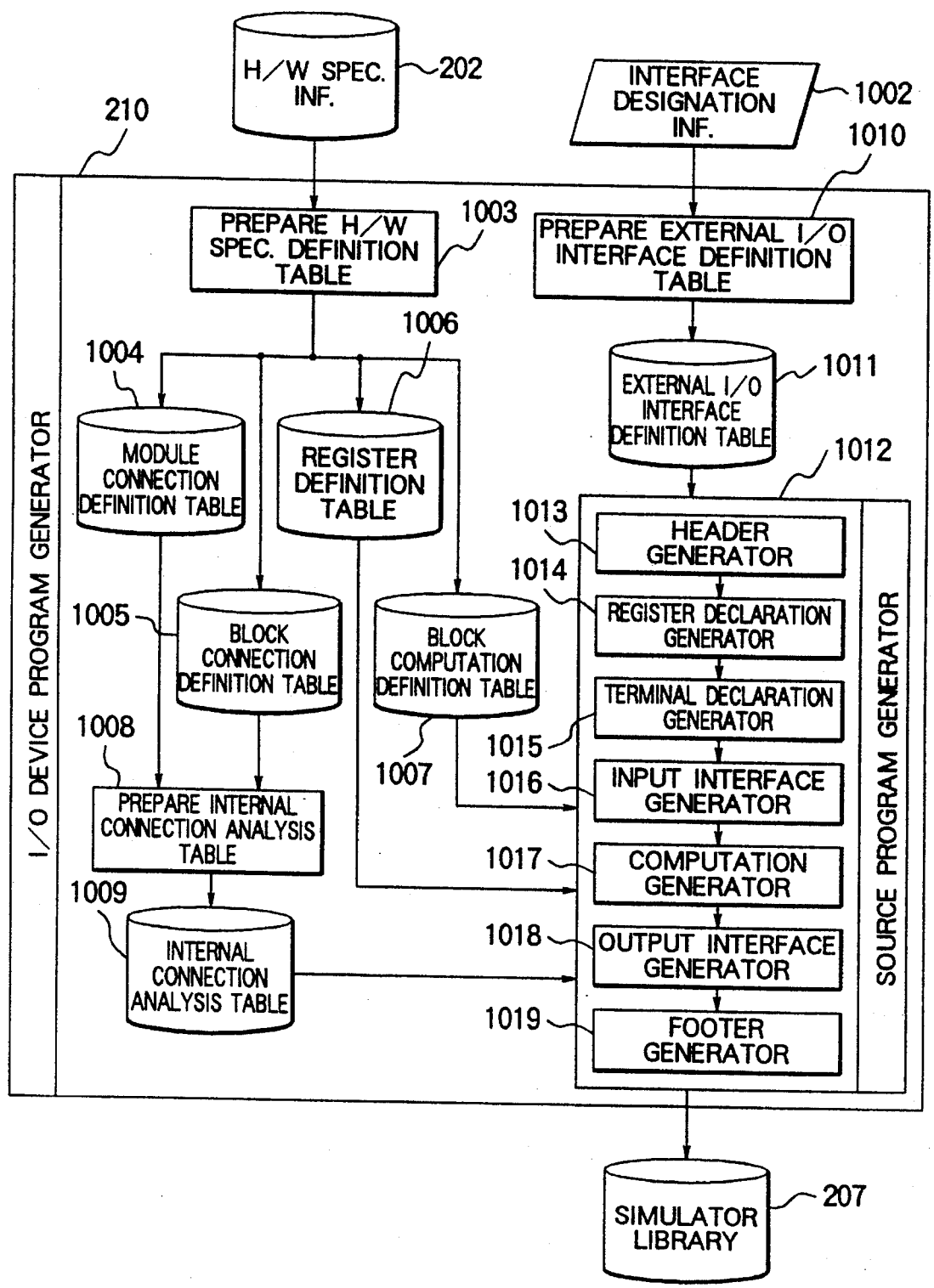
FIG. 26 is a block diagram showing the procedure for processing the generation of the I/O device program.
Figure 27A:
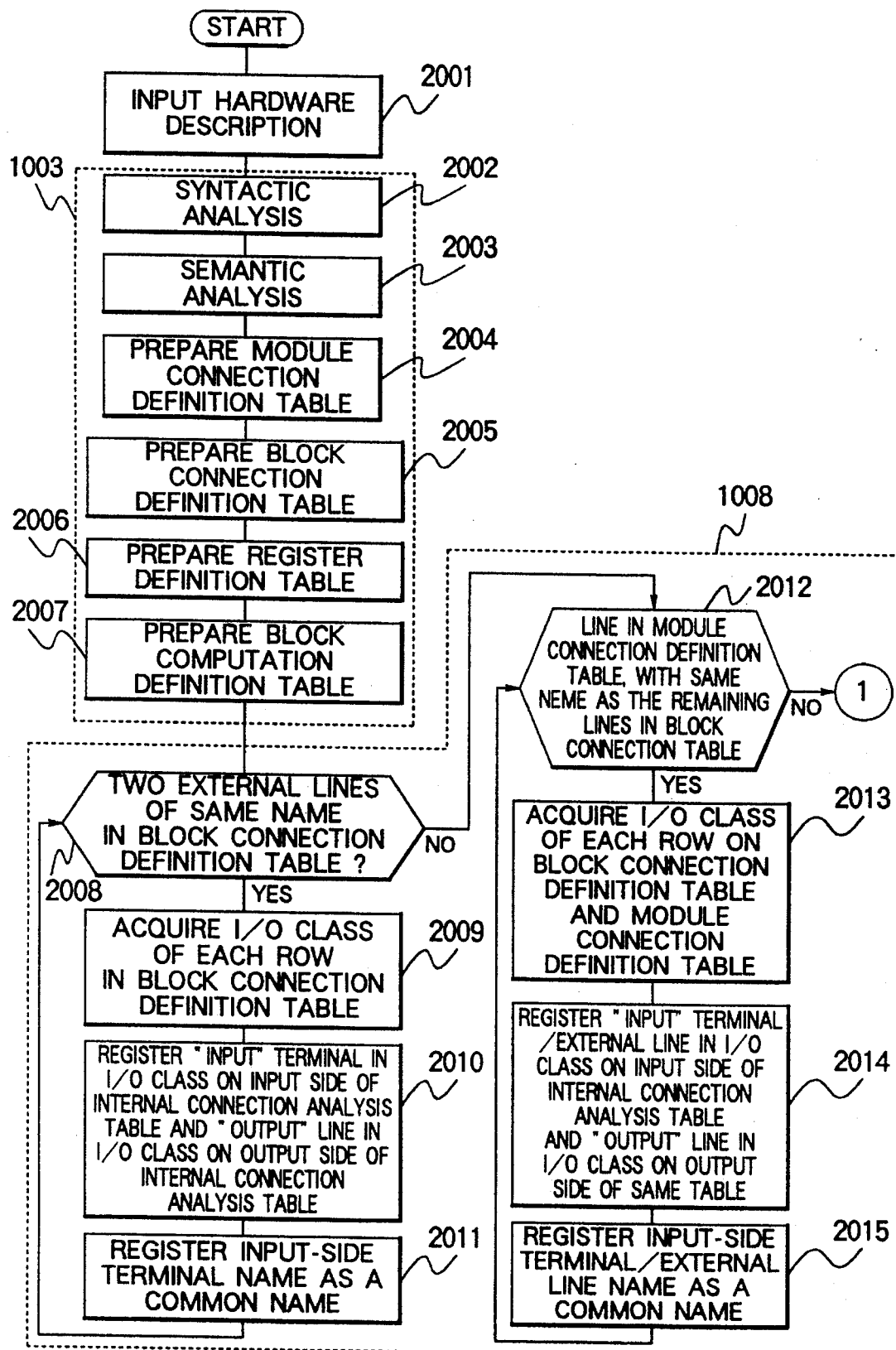
FIG. 27A is a flowchart for preparing a hardware specification definition table and an internal connection analysis table.
Figure 27B:
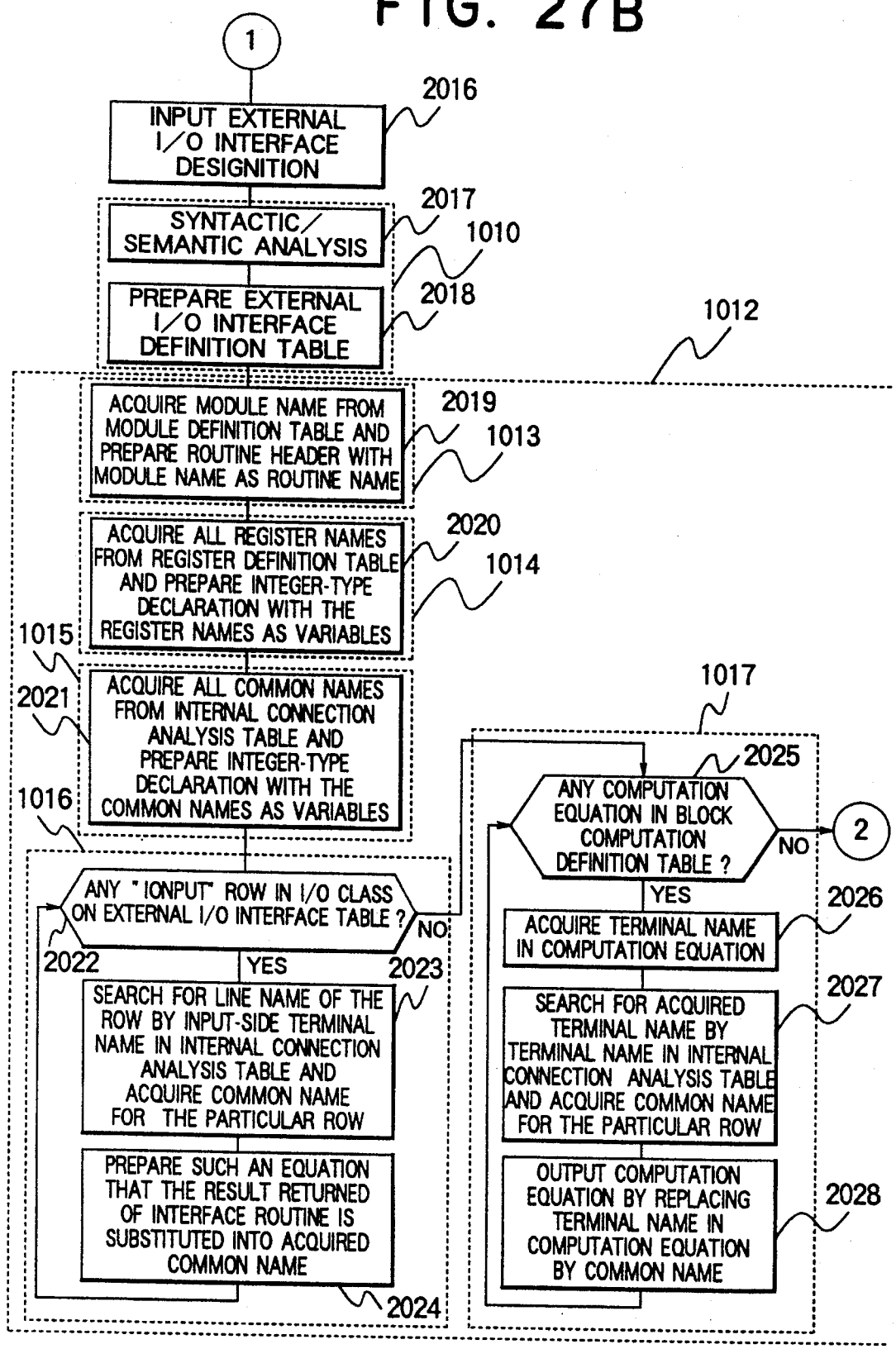
FIG. 27B is a flowchart for generating a source program.
Figure 27C:
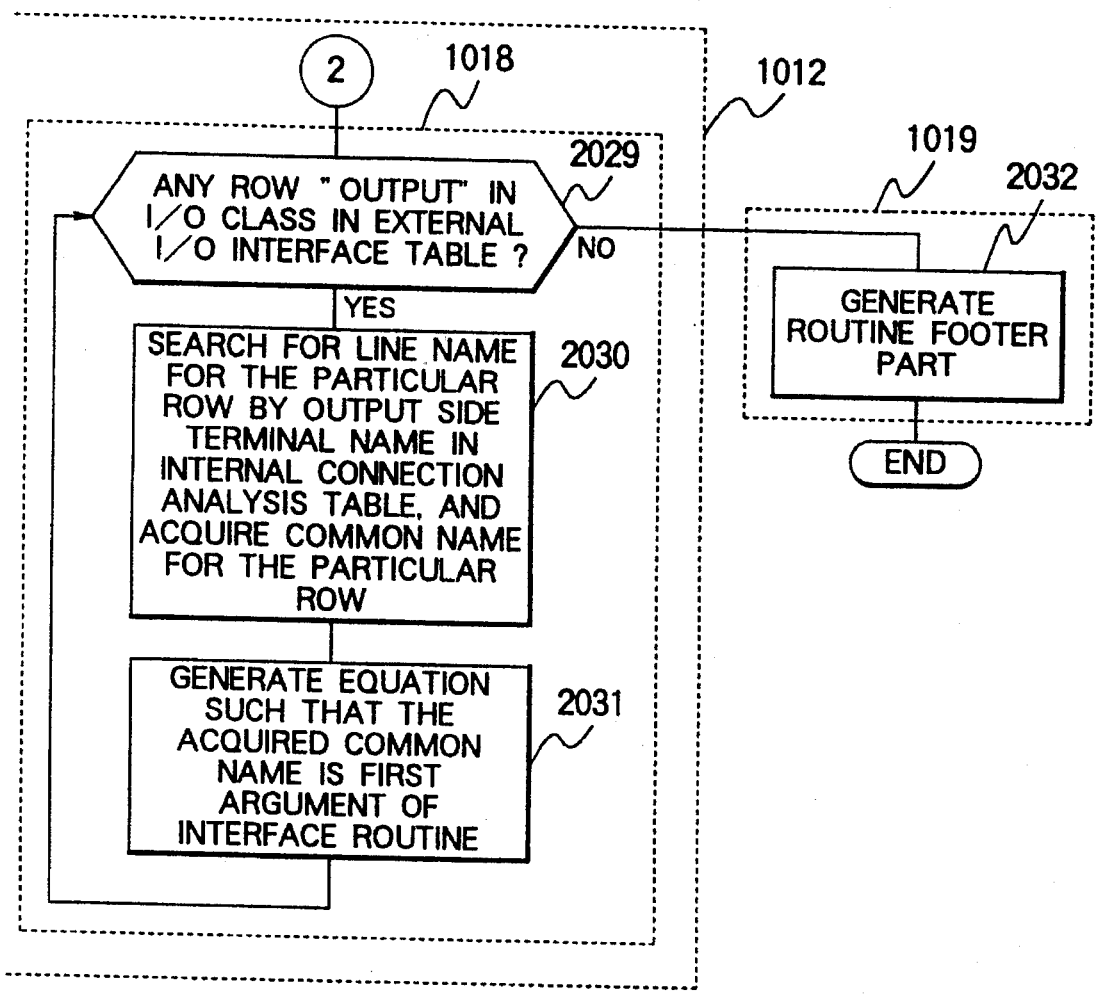
FIG. 27C is a flowchart for generating a source program.

FIG. 26 is a block diagram showing an outline of the I/O device program generation step 210. FIGS. 27A, 27B and 27C are flowcharts showing the detailed steps of the I/O device program generation process 210. FIG. 28 is a block diagram showing the configuration of a simulator generated according to the present invention.

Figure 28:
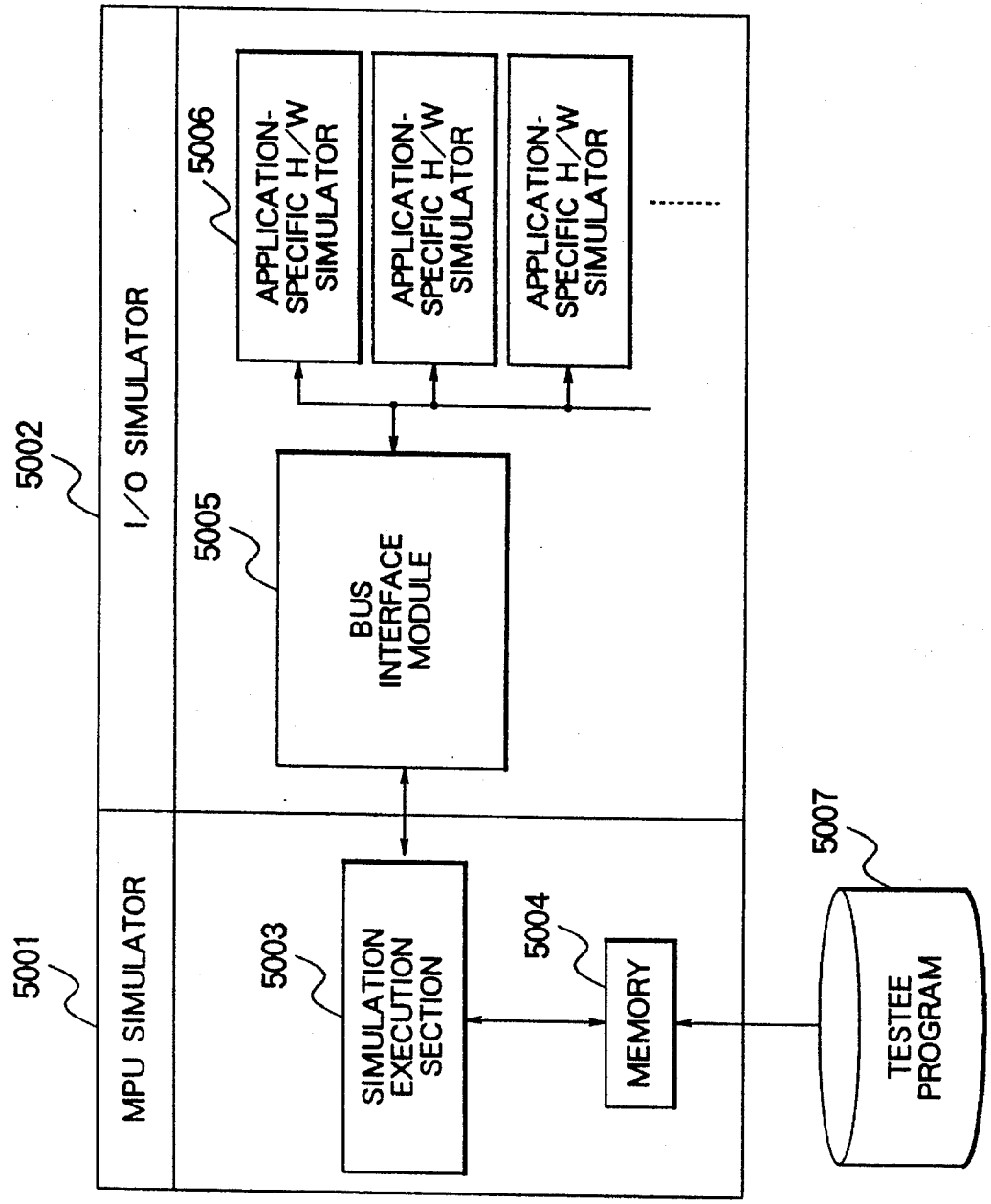
FIG. 28 shows the configuration of a simulator to which the invention is applied.

The simulator shown in FIG. 28 is made up of an MPU simulator 5001 and an I/O simulator 5002. The MPU simulator 5001 simulates the instruction of the MPU (Micro Processor Unit) for executing the testee program 5007 read into the memory 5004 of the general-purpose computer. The I/O simulator 5002 simulates the behavior of peripheral device with respect to the input and output signals which may be applied to or supplied from the peripheral device by the MPU simulator as a result of the simulation executed by the MPU simulator according to the testee program 5007. The I/O 5002 includes an application-specific hardware simulator 5006 for simulating the behavior of the various I/O devices and the I/O bus interface module 5005 that simulates the operation of the bus with respect to the input and output signals to and from the MPU simulator and at the same time controls the mutual execution of the application-specific hardware simulators. In the method of preparing the application-specific hardware simulator according to the invention, in particular, the source program for the simulator is prepared.

Figure 29:
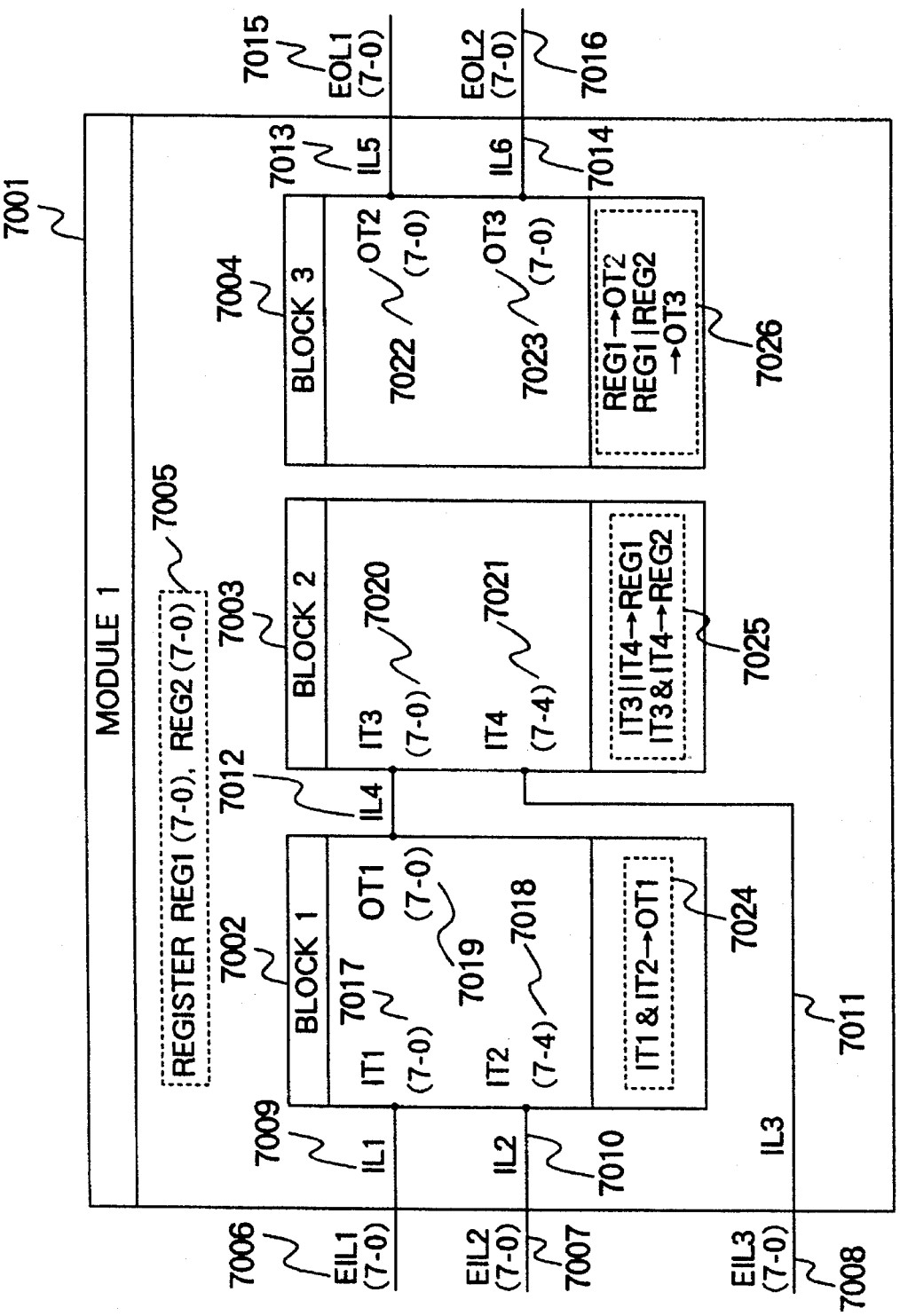
FIG. 29 shows an example of a hardware configuration of the I/O devices.

FIG. 29 shows an example of the hardware specification of the I/O devices providing an object to be simulated. The I/O devices will specifically be explained below.

The frame 7001 shown in FIG. 29, which represents the outmost facility unit of the system, is called the module. The module name attached to the frame 7001 is assumed to be "module 1". The input lines EIL1 (7006), EIL2 (7007), EIL3 (7008) to and the output lines EOL1 (7015), EOL2 (7016) from the module 1 are all 8-bit lines covering bits 7 to 0. This I/O device has two registers therein names REG1 and REG2 (7005) respectively. Blocks 7002, 7003, 7004 are facility units beyond which the block is inseparable. The blocks 7002, 7003, 7004 are named "block 1" "block 2" and "block 3" respectively.

Now, the connection of module 1 (7001) will be explained. The external input lines EIL1 (7006), EIL2 (7007), EIL3 (7008) to module 1 (7001) are connected to lines IL1 (7009), IL2 (7010), IL3 (7011) in module 1. These lines are connected to the input terminals IT1 (7017), IT2 (7018) of block 1 (7002) and the input terminal IT4 (7021) of block 2 (7003), respectively. The input terminal IT1 (7017) of block 1 (7002) an 8-bit terminal for bits 7 to 0, which is supplied with the data of IL1 (7009) directly. Since the input terminals IT2 (7018), IT4 (7021) are a 4-bit terminal for bits 7 to 4, however, IT2 (7018) is supplied with the 4-bit data from bits 7 to 4 of IL2 (7010), and IT4 (7021) with the 4-bit data for bits 7 to 4 of IL3 (7011). Further, the output terminal OT1 (7019) of block 1 (7002) and the input terminal IT3 (7020) of block 2 (7003) are connected by an internal line IL4 (7012). Also, the output terminals OT2 (7022), OT3 (7023) of block 3 (7004) are composed of an 8-bit terminal for bits 7 to 0 respectively. These terminals are connected to the external output lines EOL1 (7015), EOL2 (7016) of module 1 by the internal lines IL5 (7013), IL6 (7014) of module 1, respectively.

Each block providing a minimum facility unit performs the computation as predetermined. Block 1 (7002) performs the computation IT1 & IT2→OT1 (7024). For this computation, the logic product (AND) is taken of the terminals IT1 (7017) and IT2 (7018) for each bit, and the result thereof is applied to the terminal OT1 (7019). In similar fashion, the computation performed at block 2 (7008) includes IT3|IT4→REG1 and IT3 & IT4→REG2 (7025), where "|" represents the OR operation. The computation performed at block 3 (7004) includes REG1→OT2 and REG1|REG2→OT3 (7026).

Now, explanation will be made about the operation of each section in FIG. 26 with reference to the flowcharts of FIGS. 27A, 27B and 27C. First, the user applies the hardware specification information 202 of the I/O device 7001 (FIG. 29) to be simulated by the I/O simulation from the input device 102 (step 2001). This hardware specification information is described by the hardware description language (HDL). An example of the hardware specification corresponding to the system architecture shown in FIG. 29 as expressed in the hardware description language (HDL) is shown in FIG. 37. In FIG. 37, the register definition 7005 and the computation definitions 7024 to 7026 shown in FIG. 29 are eliminated by way of simplification.

Next, the hardware specification definition table generation step 1003 subjects the inputted hardware description to the syntactic analysis (step 2002) and semantic analysis (step 2003), so that the required information are stored in the module connection definition table 1004 (step 2004), the block connection definition table 1005 (step 2005), the register definition table 1006 (step 2006) and the block computation definition table 1007 (step 2007) respectively.

The module connection definition table 1004 has stored therein, for each module (8002), the external line name (8003), the internal line name (8005), the corresponding effective bit range (8004, 8006) and the I/O class as viewed from the module of the external line as shown in FIG. 30. The contents shown on row 8008, for example, indicate that the bits 7 to 0 of the external line EIL1 (7006) applied to module 1 correspond to bits 7 to 0 of the internal line IL1 (7009), and that the external line EIL1 (7006) is an input to module 1.

The block connection definition table 1005, as shown in FIG. 31, has stored therein the external line name (9003), the internal terminal name (9005), corresponding effective bit ranges (9004, 9006) and the I/O class (9007) of the terminal as viewed from a particular block for each block. The contents showing the row 9008 indicate, for example, that the bits 7 to 0 of the external line IL1 (7009) applied to the block 1 correspond to the bits 7 to 0 of the terminal IT1 (7017) in the module, and that the external line IL1 (7009) provides an input for block 1.

The register definition table 1006 has stored therein, as shown in FIG. 32, the internal register name (10003) and the bit width thereof (1004) for each module (10002). The contents shown in the table 1006, for example, are such that the register (7005) defined by module 1 (7001) includes REG1 and REG2, each indicating that bits from 7 to 0 are waited for.

The block computation definition table 1007, as shown in FIG. 33, has stored therein the equation (11003) of computation effected for each block, the terminal name/register name (11004) used for the computation, and the effective bit range (11005) used for the computation. The contents shown on row 11006, for example, indicate that the computation IT1 & IT2→OT1 (7024) is performed using the terminals IT1 (7017), IT2 (7018), OT1 (7019) at block 1 (7002).

Next, the internal connection analysis table generation step 1008 prepares the internal connection analysis table 1009 storing a common name attached as a name for output of the source program and the connection between the block and the external terminal of the module from the module connection definition table 1004 and the block connection definition table 1005. A configuration of the internal connection analysis table 1009 is shown in FIG. 34.

Returning again to FIG. 27A, the internal connection analysis table generation step 1008 will be explained in detail.

First, step 2008 checks whether the block connection definition table 1005 contains the same name of block external line. If there is any block external line of the same name, the terminals on the associated rows are input/output terminals using the same line. Therefore, the I/O class for these rows is taken out (step 2009), so that the terminal associated with "input" row in I/O class is registered with the input side of the internal connection analysis table 1009, while the terminal associated with "output" row in I/O class is registered with the output side of the internal connection analysis table 1009 (step 2010). The terminal name on output side is registered as a common name for source output of the respective terminals (step 2011).

In the block connection definition table 1005 shown in FIG. 31, for example, the block external line IL4 (7012) on row 9009 is included also in the block external line of the row 9010 in the same table 9010. The terminals OT1 (7019), IT3 (7020) connected to them are therefore registered on row 1210 of the internal connection analysis table 1009 shown in FIG. 34. More specifically, OT1 is registered with the output side terminal (7019), block 1 with the block name (12002), OT1 with the terminal name (12003), and "7–0" with the effective bit (12004), respectively. Also, IT3 is registered with the input side terminal (7020), block 2 with the block name (12005), IT3 with the terminal name (12006), and "7–0" with the effective bit (12007). The output side name OT1 as a name (12008) shared by these terminals is registered with these terminals. This process is repeated until the external line of the same name disappears from the block connection definition table (loop from steps 2008 to 2011 in FIG. 27A).

Step 2008 in FIG. 27A checks whether the line of the same name as the remaining external line 9003 of the block connection definition table 1005 remains for the internal line 8005 of the module connection definition table 1005 after disappearance of the external line of the same name to be registered with the table 1009 from the block connection definition table 1005 (step 2012). In the presence of a line of the identical name, the module external line 8003 and the terminal 9005 indicated on the associated rows are in the same relation as between the external input line/output line and a block terminal beyond. The I/O class stored in the corresponding row in the respective tables is thus taken out (step 2013), and the terminal/external line on the "input" row in I/O class is registered with the output side of the internal connection analysis table (step 2014). The terminal/external line name on input side is then registered as a common name for the source output of the terminal/external line (step 2015). This operation is repeated for all the remaining external lines of the block connection definition table 1005.

In the block connection definition table 1005 shown in FIG. 31, for example, the block external line IL1 (7009) on row 9008 is absent on the other rows in the same table. As a result, step 2012 searches for the line of the same name as the internal line of the module connection definition table 1004. Since IL1 is on row 8008, the terminal IT1 (7017) connected to this line and the module external line EIL1 (7006) are registered on row 12009 of the internal connection analysis table 1009. In other words, EIL1 is registered with the external input line (7006), EIL1 with the terminal name (12003), and "7–0" with the effective bit (12004), respectively. Also, IT1 is registered with the input side terminal (7017), block 1 with the block name (12005), IT1 with the terminal name (12006), and 7-0 with the effective bit (12007), respectively (step 2014). The input side name EIL1 is registered as a name (12008) shared by these terminals (step 2015). This operation is repeated until the line of the same name as the external line 9003 remaining in the block connection definition table 1005 disappears from the internal line 8005 of the module connection definition table 1004 (loop of steps 2012 to 2015).

Step 2012 checks whether the line of the same name as the remaining external line 9003 of the block connection definition table 1004 is present in the internal line 8005 of the module connection definition table 1004. In the case where there is no line of the same name as the remaining external line 9003 of the block connection definition table 1005 in the internal line 8005 of the module connection definition table 1004, the process proceeds to the step in FIG. 27B.

In FIG. 27B, the user inputs the user information including the interface routine for data conversion between the application-specific hardware simulator and the actual hardware specification of the I/O device and the corresponding description of signal and interface routine 1002 indicative of the correspondence with the external I/O line of the I/O device (step 2016). According to this embodiment, the source program for the hardware simulation model described in C language is generated. As a result, the interface routine is one (function) described in C language. The interface, which depends on the class of MPU simulated and the application-specific hardware simulator, is generated by the user in advance and stored in the correspondence description of signal and interface routine information 1002. The interface can alternatively be provided as a library from the MPU simulator.

The external I/O interface definition table generation step 1010 shown in FIG. 26 performs the syntactic analysis/semantic analysis of the routine contained in the corresponding description of signal and interface routine inputted by conversational processing with the user (step 2017), thereby preparing the external I/O interface definition table 1011 (step 2018). As shown in FIG. 35, the external I/O interface definition table thus prepared includes the interface routine name (13004), the corresponding module external I/O line name (13002), the corresponding effective bit (1303) and the I/O class (13005), for example. The contents shown on line 13006 in FIG. 35 indicate that the input to bit 0 from bit 7 of the external input EIL1 (7006) is supplied by the interface routine "getAbus ( )".

In the next step, the source program generation step 1012 generates the source program 1020 for the I/O device program. An example of the source program for the I/O device program generated according to the present embodiment is shown in FIG. 36. The procedure for generating this source program is explained with reference to FIGS. 26, 27B, 27C and 36.

First, the header generation step 1013 retrieves the module name (8002) from the module connection definition table 1004, and with this module name as a routine (function), generates the headers 14001, 14002 of the routine (function) (step 2019), The register declaration generation step 1014 retrieves all the register names of integer type (10003) from the register definition table 1006, and produces the integer-type declaration 14003 with the register names as variables (step 2020).

The terminal declaration generation step 1015 retrieves all the common names (12008) from the internal connection analysis table 1009, and with these common names as variables, generates an integer-type declaration 14004 (step 2021).

The I/O interface generation step 1016 generates the external input interfaces 14006, 14007, 14008. The I/O class 13005 of the external I/O interface definition table 1011 (FIG. 35) is checked as to whether there is any row associated with class "input" (step 2022). If there is any row of class "input", the column of the terminal name/line name 12003 of the output side terminal/external input line in the internal connection analysis table 1009 is searched with the line name 13002 of the particular line as a key, thereby retrieving the common name 12008 for the line 13002 (step 2028). An equation in which the result returned by the interface function 10004 is substituted into the common name 12008 thus retrieved is produced (step 2024). The loop from steps 2022 to 2024 is repeated until the disappearance of a row where the I/O class 13005 of the external I/O interface definition table 1011 is "input".

In the case where step 2022 decides that there is not any row where the I/O class 13005 of the external I/O interface definition table 1011 is "input", the computation generation step 1017 is executed thereby to generate the block computation sections 14009, 14010, 14011, 14012, 14013 as shown by the source program examples in FIG. 36. More specifically, the computation generation step 1017 decides whether a computation equation is contained in the block computation definition table 1007 shown in FIG. 33 (step 2025). If there is any computation equation contained, the terminal names used for each equation are retrieved (step 2026), and with the terminal names thus retrieved, the terminal/line name column of the internal connection analysis table 1009 shown in FIG. 34 is searched (12003, 12006), so that a common name stored in the row searched is retrieved (step 2027). The terminal name in the computation equation is replaced by the common name, and a substitute statement is produced as one in C language (step 2028). The loop of steps 2025 to 2028 is repeated until the computation equation disappears from the block computation definition table 1007.

In the case where the decision at step 2025 shows the disappearance of an unprocessed computation equation, the output interface generation step 1018 shown in FIG. 27C is executed, and the external input interfaces 14014, 1015 as shown in FIG. 36 are generated. More specifically, the output interface generation step 1018 checks whether there is any row where the I/O class 13005 of the external I/O interface table 1011 is "output" (step 2029). If there is any row where the I/O class 13005 is "output", the column of the terminal name/line name 12006 of the input side terminal/ external output line of the internal connection analysis table 1009 shown in FIG. 34 is searched thereby to retrieve the common name 12008 stored in the row involved (step 2030). The equation thus retrieves is the one of such a type that the retrieved common name 12008 is inserted into the argument of the interface routine (function) 14004 (step 2031). The loop of steps 2029 to 2031 is repeated until the row where the I/O class 13005 of the external I/O interface table 1011 is "output" disappears.

In the case where the row where the I/O class 13005 of the external I/O interface table 1011 is "output" disappears, the footer generation step 1019 generates the footer section 14016 of the function (step 2032).

The above-mentioned operation generates the source program of the hardware simulation model as shown in FIG. 36 and is stored in the simulator library 207.

According to the above-mentioned embodiment, the source program of the hardware simulation model of the application-specific hardware simulator is generated by the hardware specification description written at the time of designing the I/O device. As a result, even when the system to which the application-specific hardware simulator is applied is changed, the person who prepares the simulator who may not be informed of the hardware detail of the I/O device can readily prepare the application-specific hardware simulator applicable to the new system.

Also, although the hardware specification description information written in the hardware description language is inputted according to the above-mentioned embodiment, the invention is applicable also to the hardware specification described in tabular or graphical form, if easily recognizable, by tabular or graphical analysis instead of by syntactic analysis in subsequent processes.

As described above, in the method of preparing the test environmental programs according to this embodiment, the use of hardware description for hardware design facilitates the generation of the source program of the hardware simulation model of an application-specific hardware simulator, thereby making it possible to develop an application-specific hardware simulator promptly for developing a new system. As a consequence, a sophisticated test/debug operation is made possible including the input/output control of the embedded system software, thereby improving the productivity of the embedded system software.

Second Embodiment

A second embodiment of the invention is intended to support the preparation of an application-specific hardware simulator by proposing to the user the facilities to be specified in a hardware simulation model based on the specification description of system architecture 204. Further, according to the second embodiment, the hardware simulation models prepared and the test environment programs generated are stored in a parts library and are offered for reuse at the time of preparation of another test environment program.

A hardware configuration of the computer system for embodying the method for preparing the application-specific hardware simulator according to the second embodiment is similar to that shown in FIG. 1. The operation program according to the second embodiment, however, is executed by the operation flow shown in FIG. 16 instead of in FIG. 2. In the second embodiment where the I/O device program generation step 210 shown in FIG. 1 is the same as that for the first embodiment, and therefore the description of the step 210 is not included in FIG. 16.

Figure 16:
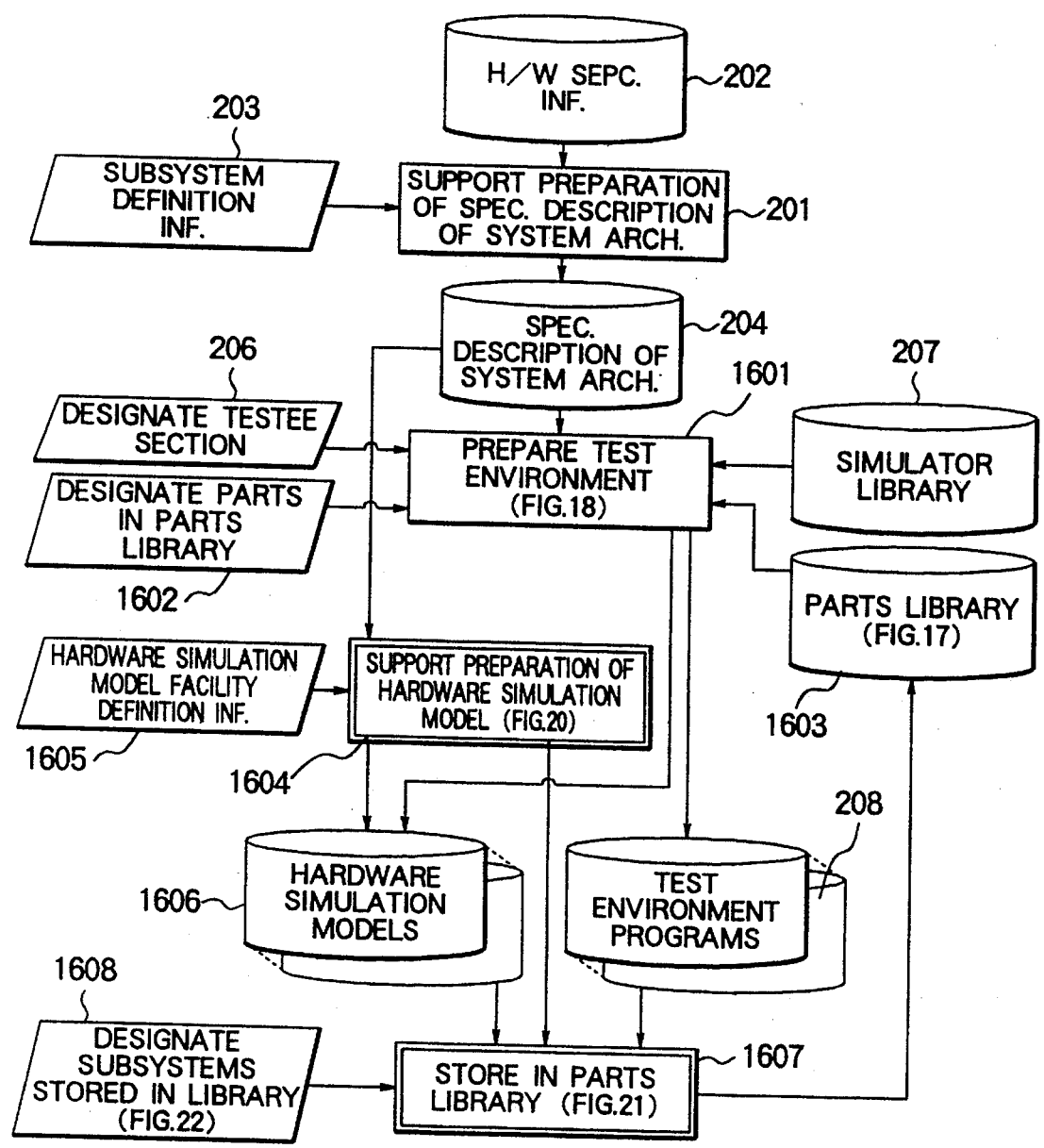
FIG. 16 shows the procedure for generating test environmental programs according to a second embodiment.

The method of preparing an application-specific hardware simulator shown in FIG. 16 includes the step 201 supporting the preparation of the specification description of system architecture, the test environment generation step 1601, the step 1604 for supporting the preparation of a hardware simulation model and the parts library storage step 1607. The component parts (201 to 204, 206 to 208) designated by the same reference numerals as those in FIG. 2 are identical to those described in FIG. 2 respectively. The step 201 for supporting the preparation of the specification description of system architecture is the same as that explained with reference to the first embodiment.

The test environment generation step 1601 replaces the test environment generation step 205 shown in FIG. 2. Upon application of the specification description of system architecture 204, the resulting conversation with the user causes the testee designation 206 and the parts library internal parts designation 1602 to be inputted, so that a part of the hardware simulation models 1606 and the test environment programs 208 are generated using the existing hardware simulation models and test environment programs held respectively in the MPU simulator and the parts library 1603 prepared in the simulator library 207.

The hardware simulation model preparation support step 1604 is supplied with the hardware simulation model facility definition information 1605 and a part of the hardware simulation models 1606 is prepared based on the result of the specification description of system architecture 204 and the test environment generation step 1601.

The parts library storage step 1607 is supplied with the library storage subsystem designation 1608 by conversation with the user based on the result of the hardware simulation model preparation support step 1604, so that the test environment programs 208 and the hardware simulation models 1606 are stored in the parts library 1603.

Figure 17:
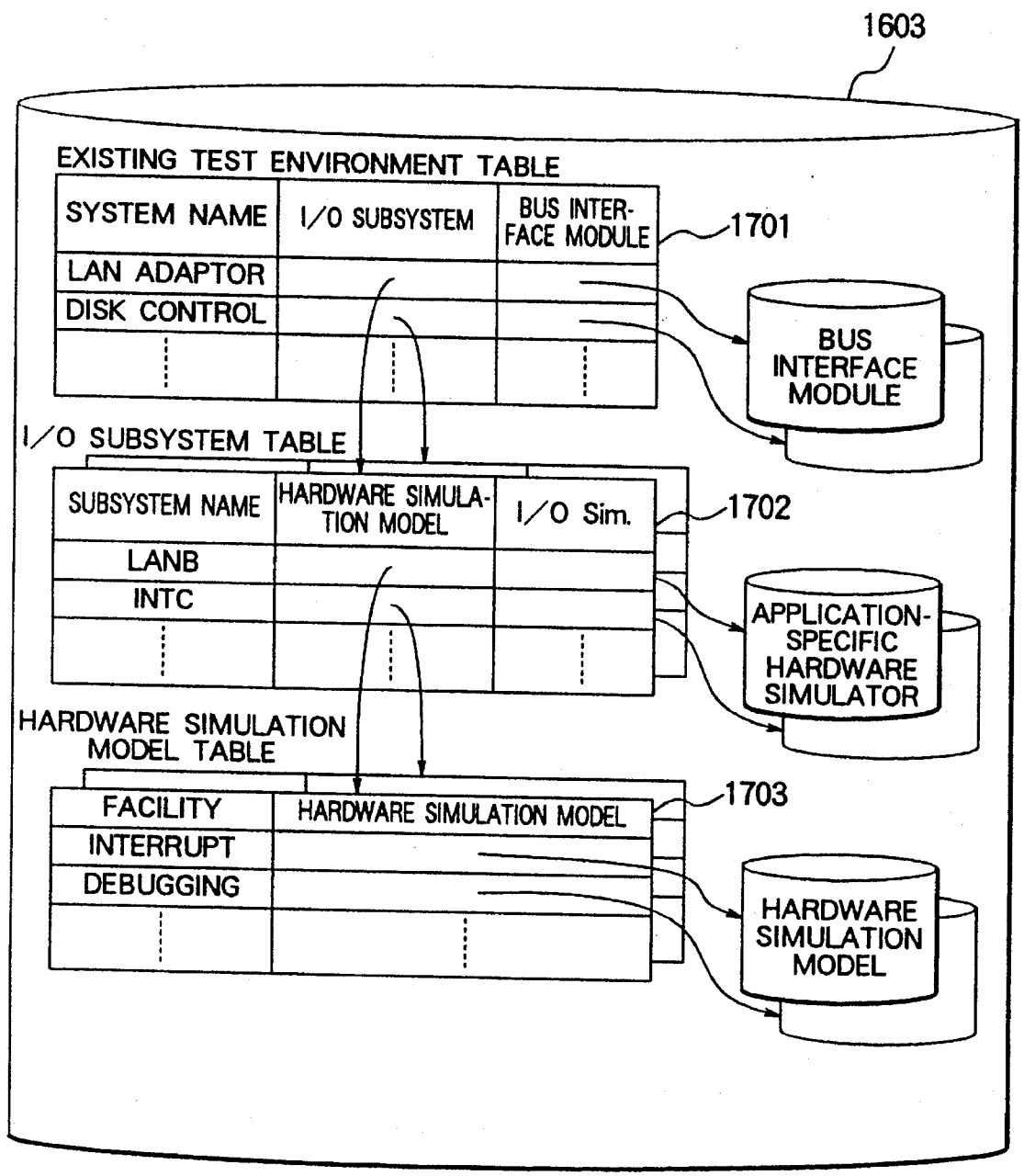
FIG. 17 shows an example of the structure of a parts library.

As shown in FIG. 17, the parts library 1603 has stored therein the test environment programs (i.e., bus interface modules, application-specific hardware simulators and hardware simulation models), which are managed by the existing test environment table 1701, the I/O subsystem table 1702 and the hardware simulation model table 1703.

The existing test environment table 1701 holds pointers to the intended system names and I/O subsystem table 1702 and pointers to corresponding bus interface modules for each test environment program stored in the parts library 1603.

The I/O subsystem table 1702 holds pointers to the subsystem name, the hardware simulation model table 1703 and corresponding application-specific hardware simulators for each subsystem (I/O subsystem) not including the testee software 701 in the subsystems making up an object system.

The hardware simulation model table 1703 holds pointers to the facility name and the hardware simulation model for each facility included in an I/O subsystem.

Figure 18:
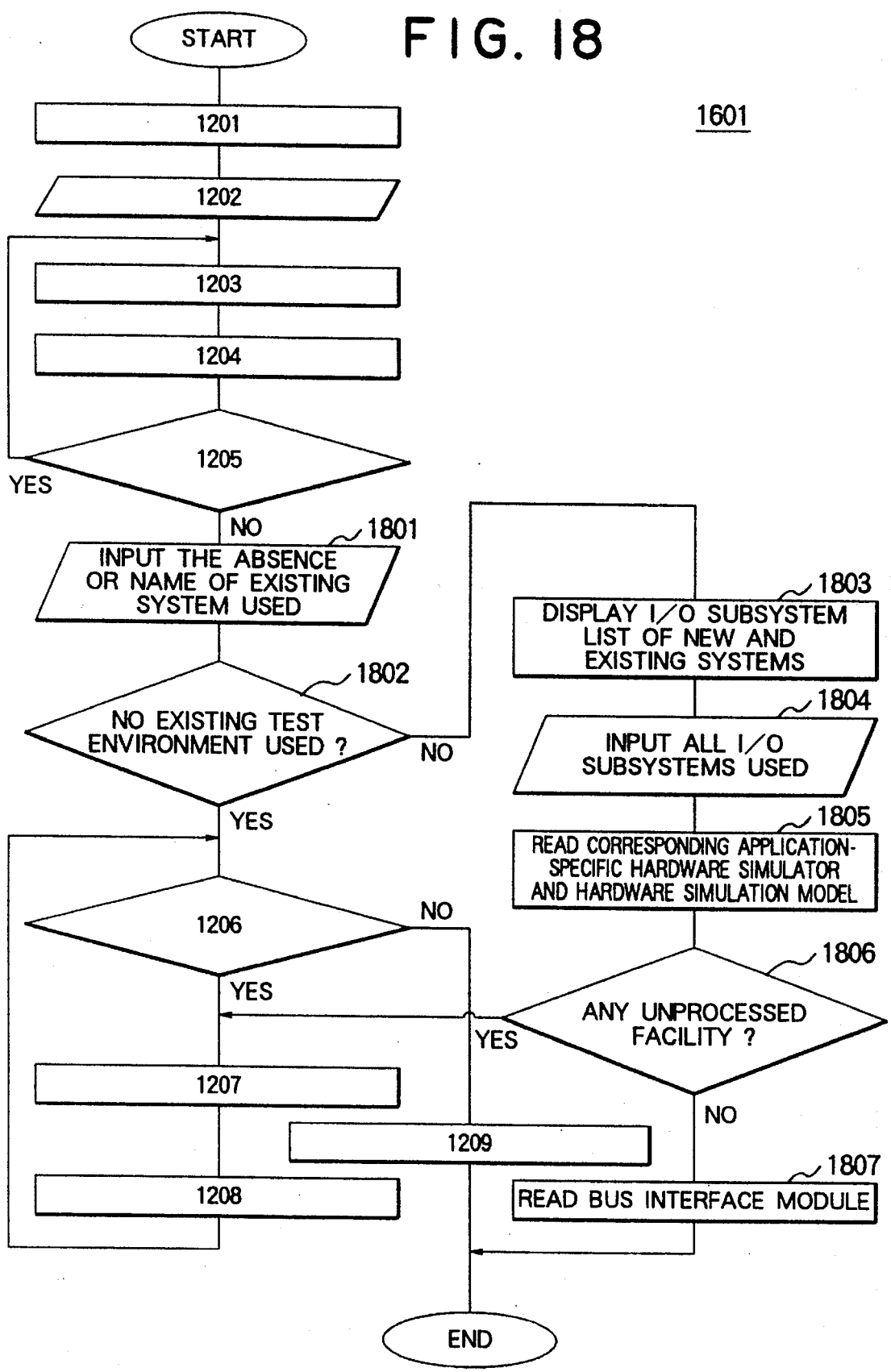
FIG. 18 is a flowchart for processing the generation of a test environment according to the second embodiment.

FIG. 18 is a flowchart for the test environment generation step 1601. In FIG. 18, the numerals inserted aloof designate the same steps as those of the same reference numerals respectively in the flowchart for the test environment generation step 205 shown in FIG. 12.

Step 1801 makes enquiry of the user as to whether there is any existing system using the existing test environment programs, and if there is any such system, causes the user to enter the particular system name. Step 1802 checks the user input, and in the absence of an existing system using the existing test environment programs, the test environment program is generated at steps 1206 to 1209 identical to those for the test environment generation step 205 in FIG. 12, thereby completing the process. In the case where there is any such an existing system using the test environment programs, on the other hand, the process proceeds to step 1803.

Step 1803 displays a list of I/O subsystems of a new system and the existing systems using the test environment programs. Step 1804 causes the user to designate the correspondence, if any, between each subsystem of the new system and the subsystems of the existing system using the test environment programs on the screen. Step 1805 reads out the application-specific hardware simulator and the hardware simulation model with reference to the hardware simulation model table 1708 and the I/O subsystem table 1702 corresponding to the designated subsystem of the existing system as a new subsystem.

Step 1806 checks to see whether all the I/O subsystems of the new system have been designated, and if there is any I/O subsystem not designated, steps 1207 and 1208 prepare an application-specific hardware simulator corresponding to the particular I/O subsystem not designated, followed by step 1209 for preparing a bus interface module for terminating the process. In the case where there is no I/O subsystem not designated, by contrast, the existing system table 1701 is referenced and a bus interface module for the new system corresponding to the existing system using the test environment programs is read out thereby to end the process.

Figure 19:
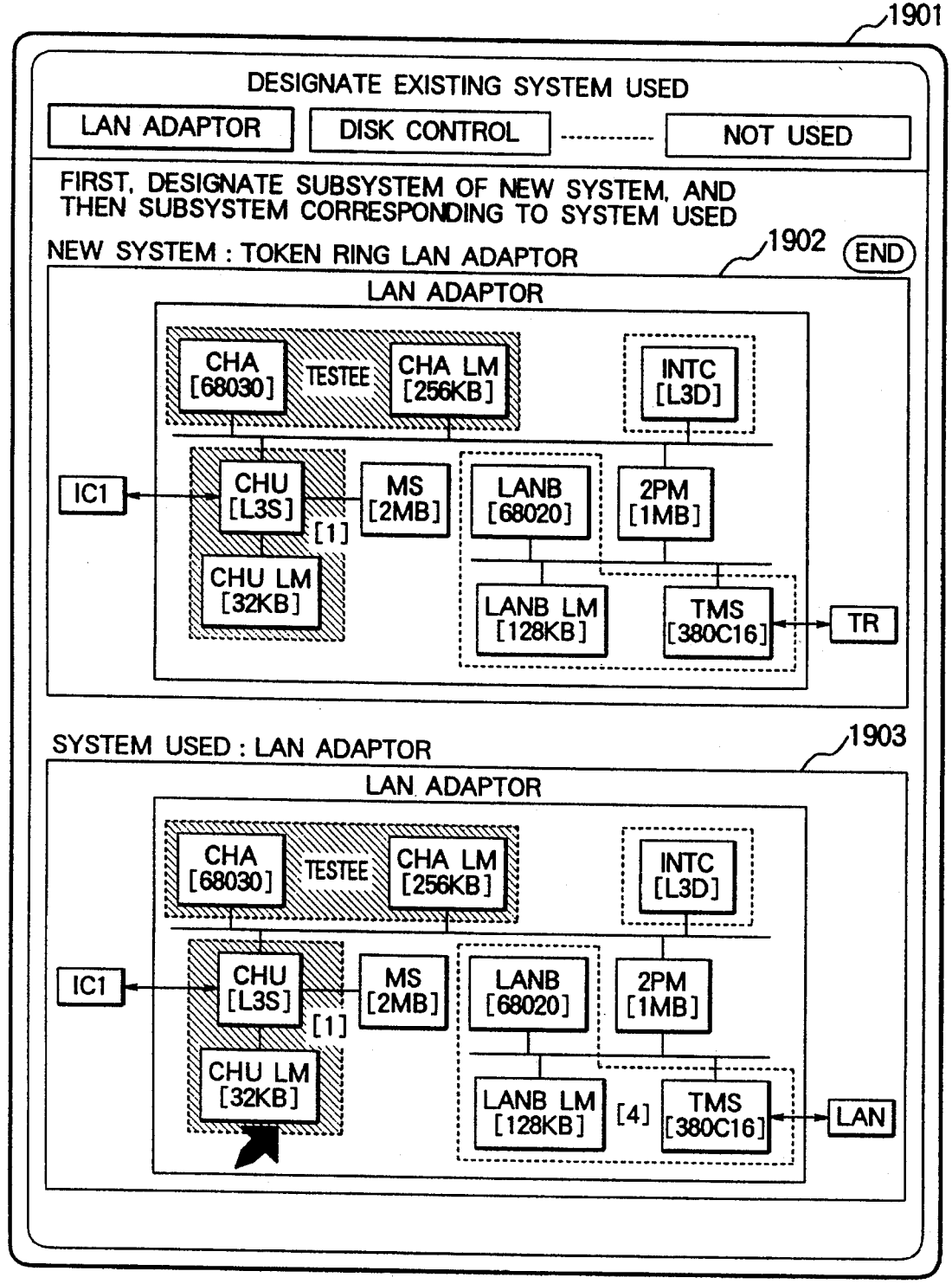
FIG. 19 shows an example of input by conversation for designating the parts to be used in the parts library.

FIG. 19 shows an example of the screen for the user to input by conversation the parts-library internally-used parts designation 1602.

The region 1901 in the upper stage is indicated by step 1601 in FIG. 18, where all the existing systems obtained from the existing test environment table 1701 are displayed, and one of them is shown caused to be designated by the user. The regions 1902, 1903 defined by the frame are for displaying all the existing system names displayed at step 1801 in FIG. 18 and obtained from the existing test environment table 1701, one of the existing system names being caused to be designated by the user. The regions 1902, 1903 defined by frame are for displaying the system architecture diagram 1902 of a new system based on the specification description of system architecture 204 and the system architecture diagram 1903 of the existing systems designated, which diagrams are displayed at steps 1803, 1804 in FIG. 18. The user is first caused to designate one subsystem out of the system architecture diagram 1902 of a new system, and then caused to designate a subsystem of a corresponding existing system from the system architecture diagram 1903 of the existing system. The subsystem designated by the user is displayed defined by hatches as shown in FIG. 19.

The subsystems can be made to correspond to each other according to the analogy of arrangement or by the names of the hardware component elements. Also, the information indicating the use of the existing system parts is added to the specification description of system architecture 204, so that the test environment generation step 1601 may determine the existing subsystem used based on the added information.

Figure 20:
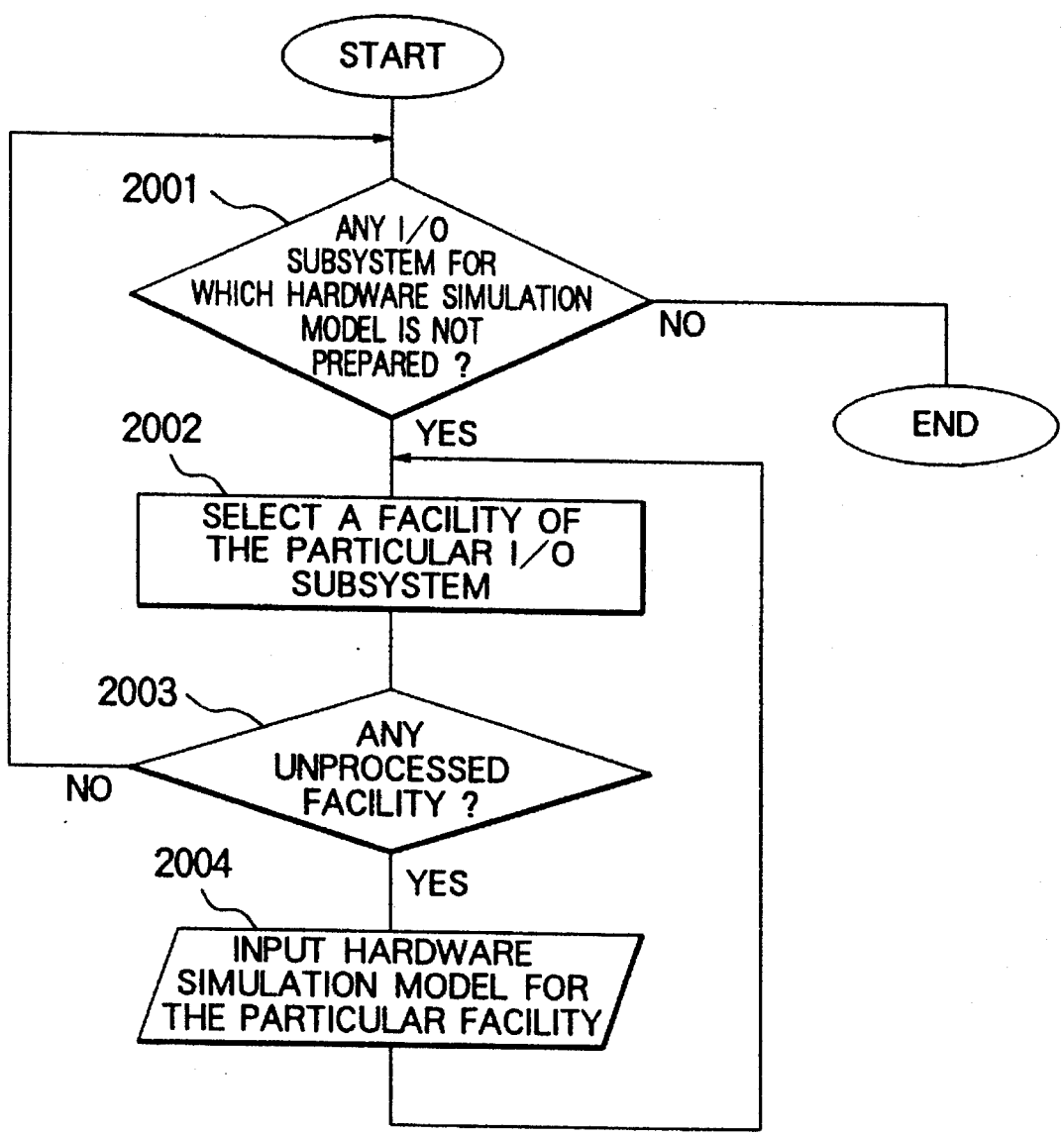
FIG. 20 is a flowchart showing the support processing for preparing a hardware simulation model.

FIG. 20 is a flowchart for the hardware simulation model preparation support step 1604. Step 2001 decides whether all I/O subsystems have been prepared using the hardware simulation models stored in the parts library 1603 on the basis of the result obtained from the test environment generation step 1601. If all the I/O subsystems have been prepared, the process is terminated, while if there is any I/O subsystem not prepared, the process proceeds to step 2002.

Step 2002 causes the user to select an I/O subsystem not prepared, and step 2003 decides whether there is any facility requiring the preparation of the hardware simulation model. If there is any facility to be prepared, the process is passed to step 2004. Otherwise, the process is returned to step 2001.

Step 2004 displays the names of the facilities requiring the preparation of a hardware simulation model, and causes the user to input the hardware simulation model definition information 1605, followed by returning to step 2002. The user's input of the hardware simulation model facility information 1605 can be supported by displaying more detailed facility information which may be contained in the specification description of system architecture 204 as well as by displaying the facility name requiring the preparation of the hardware simulation model.

Figure 21:
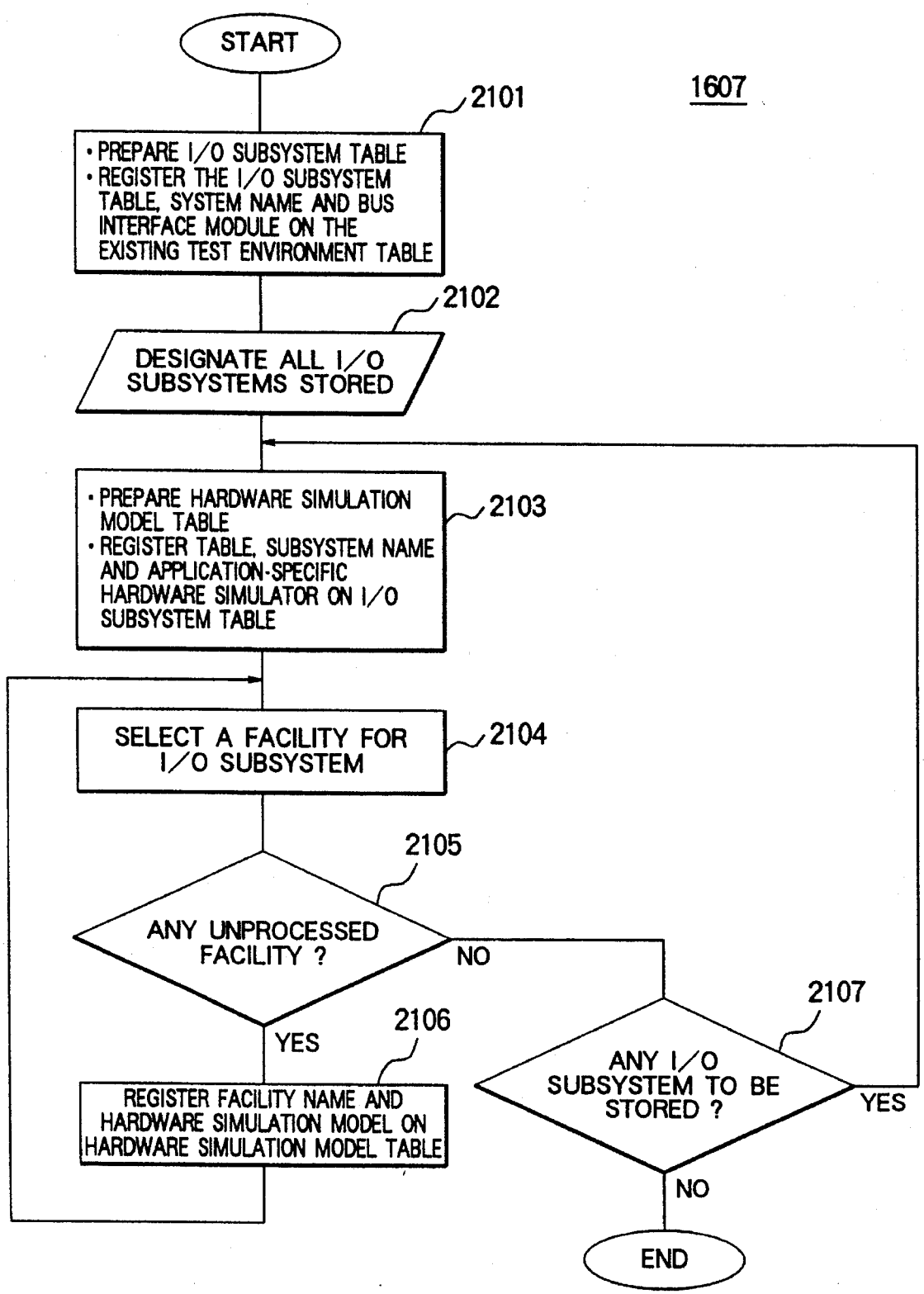
FIG. 21 is a flowchart showing the processing for storage of parts in the library.

FIG. 21 is a flowchart for the parts library storage step 1607.

Step 2101 prepares the I/O subsystem table 1702 in the parts library 1603, so that the system name intended by the test environment programs stored in the I/O subsystem table 1702, the pointers to the I/O subsystem table 1702 prepared and the pointers to the bus interface module are registered in the existing test environment table 1701.

Step 2102 causes the user to designate the I/O subsystems of the test environment programs which are stored in the parts library 1603 as a library storage subsystem designation 1608.

Figure 22:
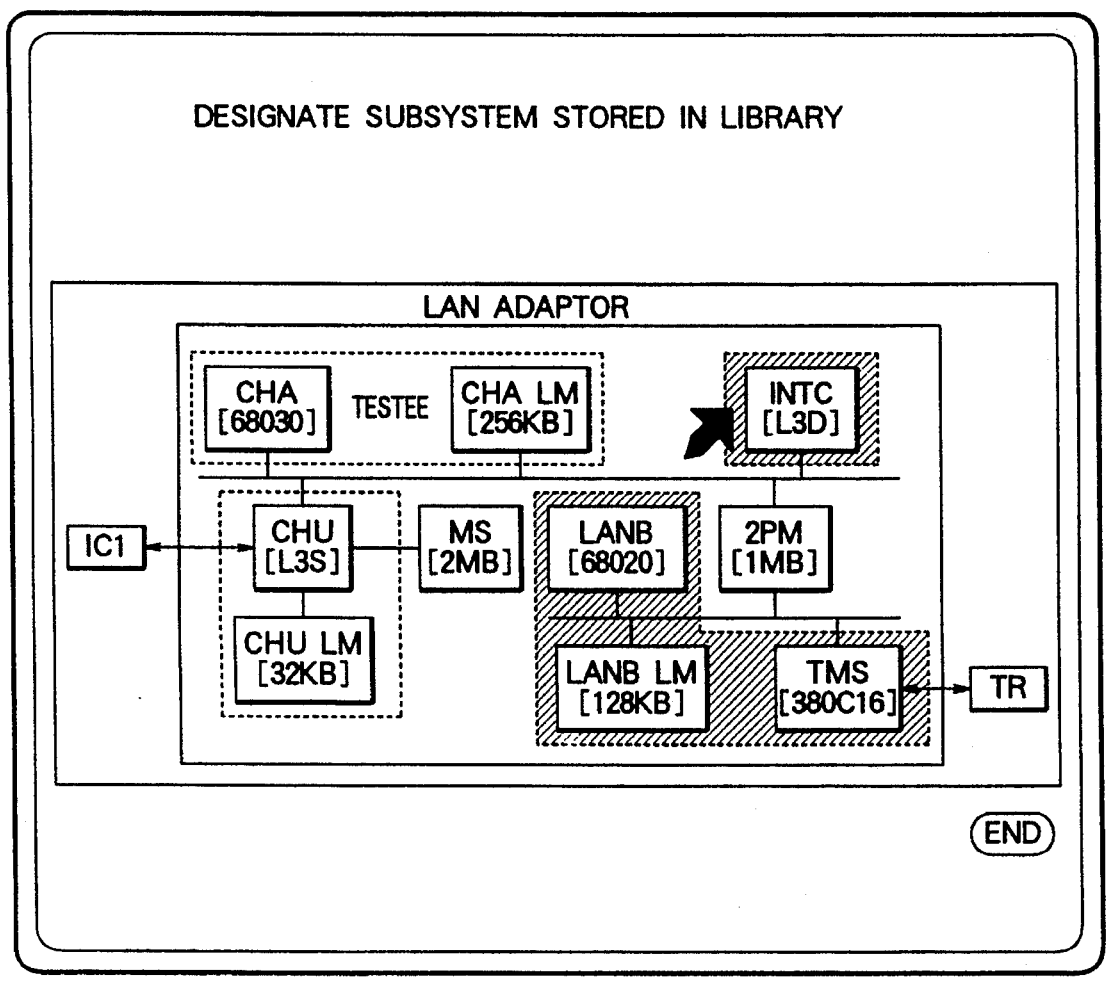
FIG. 22 shows an example of input by conversation for designation of a library stored subsystem.

FIG. 22 shows an example of screen for conversational entry of the library storage subsystem designation 1608. A system architecture diagram is displayed on the screen based on the specification description of system architecture 204, and the user is caused to designate the subsystem to be stored on the same screen. The subsystem designated by the user, as shown in FIG. 22, is displayed surrounded by hatched portions. In the process, the user can be caused to designate only the I/O subsystems newly prepared without using the existing parts by referencing the result of the hardware simulation model preparation support step 1604. Also, the user can be caused to designate all the newly-prepared I/O subsystems automatically.

Step 2103 in FIG. 21 prepares selected one of the I/O subsystems, and also prepares the hardware simulation model table 1703 in the parts library 1603 of FIG. 17 for the selected I/O subsystem, so that the subsystem name, the pointers to the prepared hardware simulation model table 1703 and the subsystem names and the pointer to the application-specific hardware simulator are registered with the I/O subsystem table 1702.

Step 2104 selects one of the facilities of the I/O subsystems being processed. Step 2105 decides whether there remains any unprocessed facility, and if there is any, the process proceeds to step 2106, and otherwise to step 2107. Step 2106 registers the hardware simulation model, so that the facility name and the pointer to the hardware simulation model are registered with the hardware simulation model table 1703, followed by returning to step 2104. Step 2107 repeats steps 2103 to 2106 for all the I/O subsystems designated, after which the process is terminated.

According to the method of preparing an application-specific hardware simulator described above, in addition to the effects of the first embodiment, the preparation of the hardware simulation model can be supported. Further, the reuse of the test environment program and the hardware simulation model is made possible.

Third Embodiment

According to the third embodiment of the present invention, the test environment programs generated are stored in the parts library after being reconstructed, and are reused at the time of generating another test environment program.

The system architecture of a computer system for implementing the method of preparing an application-specific hardware simulator according to the third embodiment is similar to that shown in FIG. 1. The operation program according to the third embodiment, however, is executed in accordance with the operation flow shown in FIG. 23 instead of in FIG. 2. According to the third embodiment, the I/O device program generation step 210 shown in FIG. 1 is the same as that for the first embodiment, and therefore the description of the process 210 is not included in FIG. 23.

Figure 23:
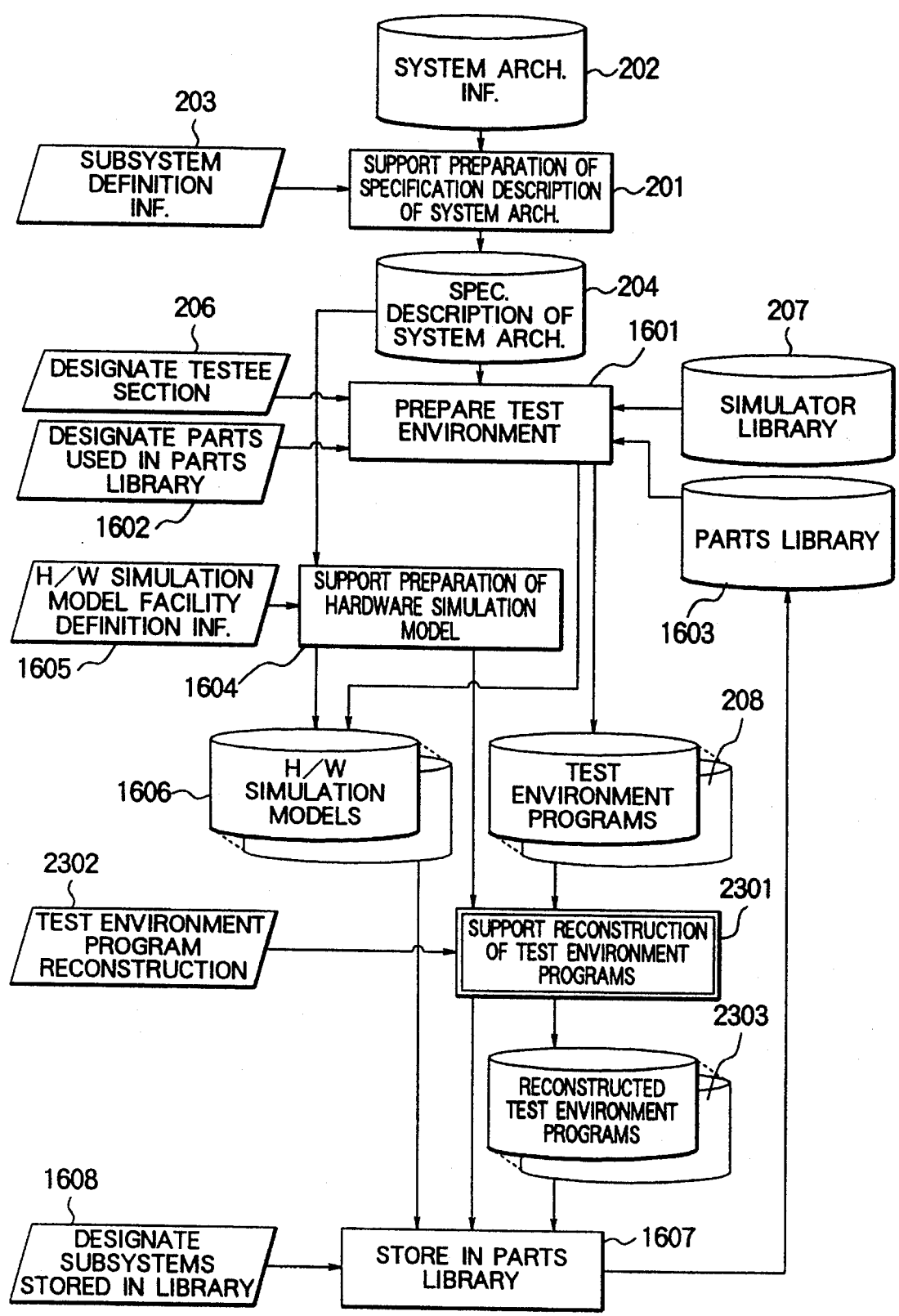
FIG. 23 shows the procedure for generating test environmental programs according to a third embodiment.

The method of preparing an application-specific hardware simulator in FIG. 23 is characterized in that the test environment program reconstruction support step 2301 is added to the operation flow according to the second embodiment shown in FIG. 16.

The test environment program reconstruction support step 2301 supports the reconstruction of the test environment programs 208 generated at the test environment generation step 1601 based on the test environment program reconstruction contents 2302 supplied from the user. More specifically, step 2301 clearly indicates the parts unrequired for reconstruction like the communication facility 706, the communication facility 716 or the processing system of hardware simulation model description language shown in FIG. 7, and thus supports the reconstruction work by the user. After reconstruction, the test environment programs 2303 are stored in the parts library 1603 by the parts storage library storage step 1607.

This method of preparing an application-specific hardware simulator described above is effective for additionally storing the facilities absent in the test environment programs for the existing systems in the case where the test environment program is required for the systems different from the existing systems in architecture.

Fourth Embodiment

According to the fourth embodiment, the specification description of system architecture 204 is prepared only by conversation with the user in the absence of the hardware specification information 202.

A system architecture of the computer system for implementing the method of preparing an application-specific hardware simulator according to the fourth embodiment is similar to that shown in FIG. 1. The program according to the fourth embodiment, however, is executed in accordance with the flowchart shown in FIG. 24 instead of in FIG. 2. In the fourth embodiment, the I/O device program generation step 210 shown in FIG. 1 is the same as that for the first embodiment, and therefore the step 210 is not described in FIG. 24.

Figure 24:
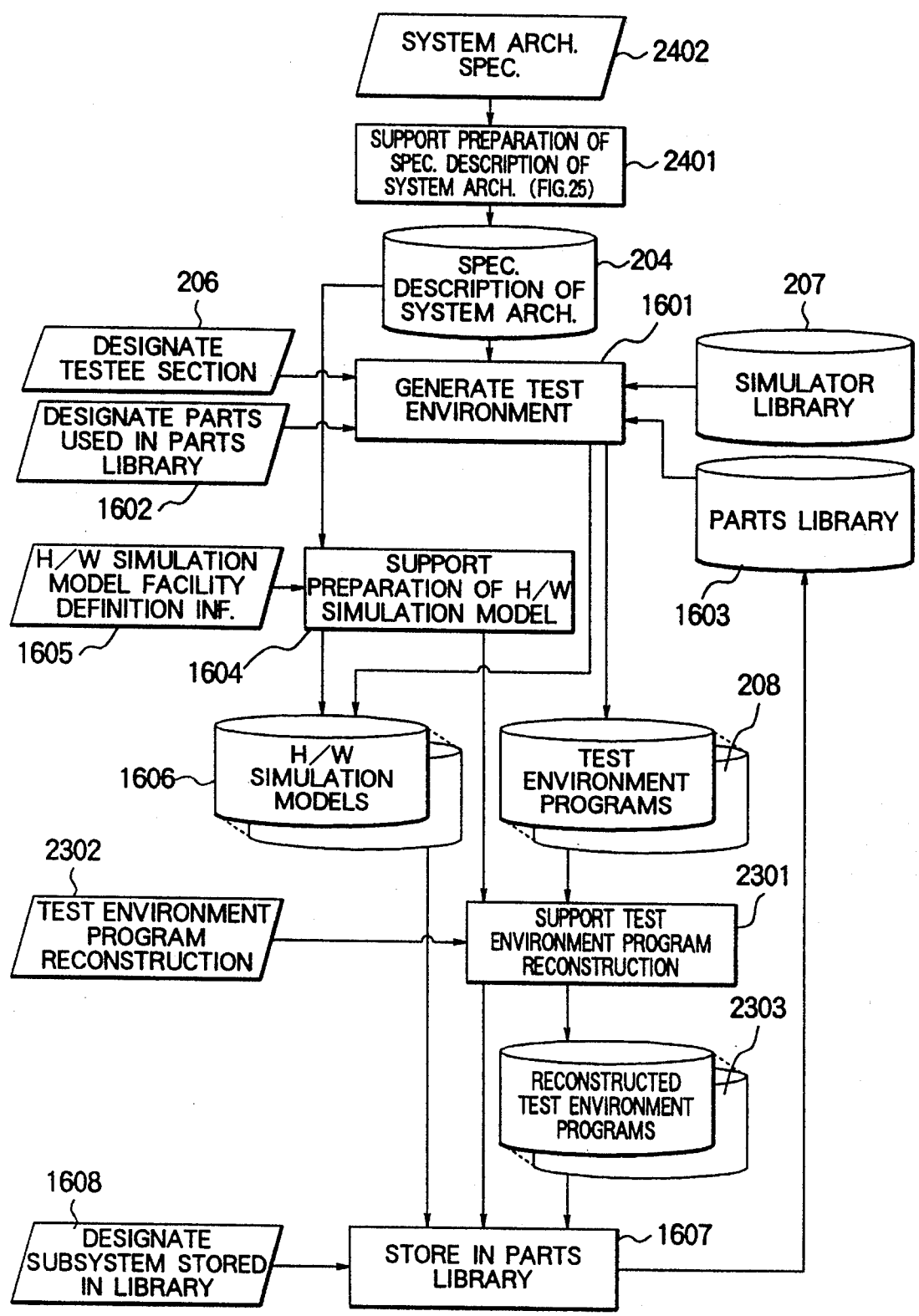
FIG. 24 shows the procedure for generating test environmental programs according to a fourth embodiment.

The method of preparing an application-specific hardware simulator shown in FIG. 24 has the feature that the specification description of system architecture preparation support step 201 according to the third embodiment shown in FIG. 23 is replaced by the specification description of system architecture input support step 2401. The specification description of system architecture input support step 2401 is such that the system architecture specification 2402 is inputted by conversation with the user thereby to prepare the specification description of system architecture 204 that can handle the test environment generation step 1601.

Figure 25:
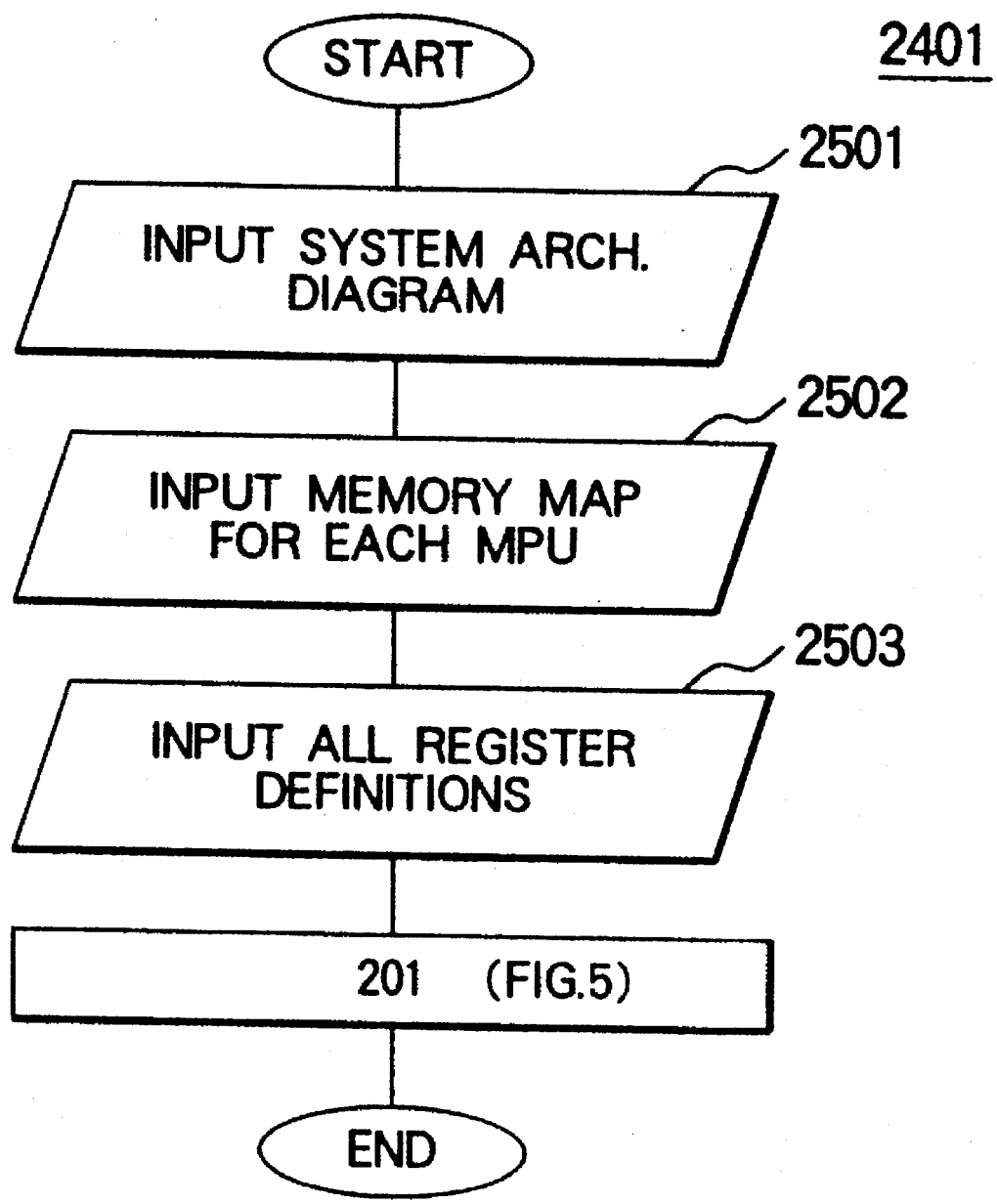
FIG. 25 is a flowchart showing the input support processing for the specification description of system architecture.

FIG. 25 is a flowchart for performing the specification description of system architecture input support step 2401. Step 1501 causes the user to input the system architecture diagram 301 (FIG. 3). This step is realized by the use of the conventional pattern editor's technique.

Step 2502 causes the user to input the address and space name on the screen with the format of the memory map 302 (FIG. 3) displayed thereon, thereby producing the memory map 302 for each MPU. Step 2503 causes the user to input the register name, address, bit position, bit name and the facility on the screen having the format of the register definition 303 (FIG. 3) displayed thereon, thereby producing the register definition 303 for each register. The processing at steps 2502, 2503 is realized by using the conventional technique of the table editor.

The hardware specification information 202 obtained at steps 2501 to 2503 is delivered to the system architecture specification description preparation support step 201 shown in FIG. 5 thereby to produce the specification description of system architecture 204.

The method of preparing the application-specific system architecture described above can produce the specification description of system architecture 204 simply by the user entering the conversational information without supplying the hardware specification information 202, and therefore is suitably applied for actual system development.

In the method of preparing an application-specific hardware simulator according to the present invention, the application-specific hardware simulator can be prepared simply by supplying system architecture information for hardware by conversational entry in data or tabular form on the computer and by entering information required for constructing the test environment programs for software by conversation in accordance with the guidance based on the system architecture information. Therefore, the burden imposed on the user for information entry required for preparing a simulator is lightened.

Further, a test environment program is automatically prepared simply by the user designating a testee section in accordance with the guidance based on the specification description of system architecture prepared from the information entered as above, thereby reducing the user burden for preparing the test environment in which the program intended by the user for test is executed.

Also, in the method of preparing an application-specific hardware simulator according to the present invention, the whole or part of the hardware simulation model and the test environment programs already prepared is registered as parts. Therefore, the parts in registration can be reused for constructing the test environment programs for a new system. This saves the labor of entering the information required for preparing a new program, and the burden on the user is reduced for program preparation.

We claim:

1. A method of preparing test environmental programs using a processor including an input device, a display unit and an external storage unit, said method comprising the steps of:

(a) inputting from the external storage unit hardware specification information relating to a system architecture of a system, said system comprising a plurality of subsystems for simulation and supplying a first guidance to said display unit, said first guidance being based on said hardware specification information and being displayed on said display unit for prompting a user to input system table information for generating a specification description of system architecture;

(b) generating the specification description of system architecture for specifying a correspondence between data contained in said hardware specification information based on subsystem definition information designating one of said plurality of said subsystems required for simulation, said subsystem definition information being inputted by the user through the input device;

(c) generating an I/O device program based on interface designation information, said interface designation information representing a correspondence between a signal line and an interface routine for data conversion and said hardware specification information, said interface designation information being input by the user through said input device; and (d) generating a program for test environmental programs by coupling said specification description of system architecture with said I/O device program based on the designation of test software for I/O operation simulation inputted by the user through said input unit in accordance with a second guidance applied to the display unit on the basis of the specification description of system architecture.

2. (Amended) The method of preparing test environmental programs according to claim 1, wherein said specification description of system architecture in said step (b) is extracted from the hardware specification information as component information, said component information accompanying component elements comprising the subsystem designated by the user in the system architecture diagram of said system and contained in the hardware specification information displayed on the display unit.

3. The method of preparing test environmental programs according to claim 1, wherein said step (d) further includes the steps of:

(d1) displaying a system architecture diagram based on the specification description of system architecture;

(d2) causing the user to designate a subsystem for executing testee software against the system architecture diagram;

(d3) extracting from the specification description of system architecture information accompanying the subsystem designated; and (d4) generating said test environmental programs by the use of a predetermined simulator library.

4. The method of preparing test environmental programs according to claim 1, wherein said program for test environmental programs executes a supplied hardware simulation model and performs a simulation operation of said subsystem with reference to data supplied externally.

5. The method of preparing test environmental programs according to claim 1, wherein said step (d) further includes the step of:

(d5) producing a hardware simulation model, an application-specific hardware simulator and a bus interface module as parts of the test environmental programs by using a predetermined parts library.

6. The method of preparing test environmental programs according to claim 5, wherein said step (d5) further includes the steps of:

(d6) causing said predetermined parts library to store a bus interface module, an application-specific hardware simulator and a hardware simulation model corresponding to a plurality of existing systems;

(d7) causing the user to designate a system analogous to an object system from among a plurality of existing systems with parts stored in the predetermined parts library;

(d8) displaying a system architecture diagram of an object system and an existing system designated;

(d9) causing the user to designate a correspondence between the subsystem using test environmental programs and the subsystem; and (d10) producing parts of the test environmental programs by using a bus interface module, an application-specific hardware simulator and a hardware simulation model corresponding to the designated subsystem.

7. The method of preparing test environmental programs according to claim 5, wherein said step (d5) further includes the steps of:

(d11) storing a bus interface module, an application-specific hardware simulator and a hardware simulation model corresponding to a plurality of existing systems in the predetermined parts library;

(d12) storing in said specification description of system architecture any of a plurality of existing systems analogous to the object system, said existing systems having parts stored in predetermined parts library;

(d13) displaying system architecture diagram of an object system and the existing system designated by the specification description of system architecture;

(d14) causing the user to designate a correspondence between the subsystem using the test environmental programs and the subsystem used; and (d15) producing the parts of the test environmental programs by the use of a bus interface module, an application-specific hardware simulator and a hardware simulation model corresponding to the designated subsystem.

8. The method of preparing test environmental programs according to claim 5, wherein said step (d5) further includes the step of:

(d16) collectively storing in said predetermined parts library, in appropriate correspondence with each other, systems corresponding to the test environmental programs generated as above as existing system names, bus interface modules contained in the test environmental programs as bus interface modules, and the application-specific hardware simulator designated by the user from among the application-specific hardware simulators included in the test environmental programs and corresponding subsystems and hardware simulation models as an application-specific hardware simulator, a subsystem name and a hardware simulation model respectively.

9. The method of preparing test environmental programs according to claim 8, wherein said step (d5) further includes the step of:

(d17) displaying the system architecture diagram of the system corresponding to the test environmental programs at the time of storing in the parts library and causing the user to designate the subsystem to be stored with respect to the particular display.

10. The method of preparing test environmental programs according to claim 5, wherein said step (d5) further includes the step of:

(d18) collectively storing in the parts library, in appropriate correspondence with each other, the systems corresponding to the generated test environmental programs as existing system names, the bus interface modules included in the test environment programs as bus interface modules, and all the application-specific hardware simulators included in the test environmental programs, corresponding subsystems and newly prepared hardware simulation models as application-specific hardware simulators, subsystem names and hardware simulation models respectively.

11. The method of preparing test environmental programs according to claim 1, wherein said step (a) further includes the step of:

performing a conversational process for supporting the user in defining the hardware simulation model.

12. The method of preparing test environmental programs according to claim 1, further comprising the step of:

performing a conversational process for supporting the user in reconstructing the test environment programs generated.

13. The method of preparing test environmental programs according to claim 1, wherein said step (c) further includes the steps of:

(c1) preparing a plurality of hardware specification definition tables representing the hardware specifications from said hardware description information;

(c2) preparing an external I/O interface definition table from the information designating the interface routine and the correspondence between the I/O devices and the interface routine; and (c3) preparing a source program for the application-specific hardware simulator by referencing to said tables.

14. The method of preparing test environmental programs according to claim 13, wherein said hardware specification definition tables includes a module connection definition table, a block connection definition table, a register definition table, a block computation definition table and an internal connection analysis table.

15. The method of preparing test environmental programs according to claim 1, wherein said step (c) further includes the step of:

providing said interface routine as a library by an MPU simulator, connected thereto.

16. The method of preparing test environmental programs according to claim 1, wherein said step (c) further includes the step of:

inputting the hardware specification of the I/O device as hardware specification information described in formal tabular form.

17. The method of preparing test environmental programs according to claim 1, wherein said step (c) further includes the step of:

inputting the hardware specification of the I/O device as hardware specification information described in formal graphical form.

18. The method of preparing test environmental programs according to claim 1, wherein said step (c) is such that said I/O device program has an external interface equivalent to said I/O device simulated.

19. A method of preparing test environmental programs using a processor including an input device, a display unit and an external storage unit, said method comprising the steps of:

(a) providing a guidance to a user to input a system architecture specification by conversation thereby to prepare a specification description of a system architecture which includes a plurality of subsystems;

(b) generating the specification description of system architecture for specifying a correspondence between data contained in hardware specification information based on subsystem definition information designating one of a plurality of subsystems required for simulation, said subsystem definition information being inputted by the user through the input device in response to the guidance;

(c) generating an I/O device program based on interface designation information, said interface designation information representing a correspondence between a signal line and an interface routine for data conversion and hardware specification information, said interface designation information being input by the user through said input device; and (d) generating a program for test environmental programs by coupling said specification description of system architecture with said I/O device program based on the designation of test software for I/O operation simulation inputted by the user through said input unit in accordance with a second guidance on the basis of the specification description of system architecture.

* * * * *